US006856950B1

(12) United States Patent
Abts et al.

(10) Patent No.: US 6,856,950 B1
(45) Date of Patent: Feb. 15, 2005

(54) ABSTRACT VERIFICATION ENVIRONMENT

(75) Inventors: Dennis Abts, Eau Claire, WI (US); Michael Roberts, Altoona, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/418,706

(22) Filed: Oct. 15, 1999

(51) Int. Cl.[7] .......................... G06F 17/50; G06G 7/62
(52) U.S. Cl. ............................ 703/13; 703/15; 703/20; 703/22; 714/741; 714/742
(58) Field of Search ............... 703/13–22; 714/724–745

(56) References Cited

U.S. PATENT DOCUMENTS

| | | | | |
|---|---|---|---|---|
| 5,732,247 | A | * | 3/1998 | Dearth et al. .................. 703/13 |
| 6,167,363 | A | * | 12/2000 | Stapleton ...................... 703/14 |
| 6,208,954 | B1 | * | 3/2001 | Houtchens .................... 703/16 |

OTHER PUBLICATIONS

Liu et al, "Software Timing Analysis Using HW/SW Cosimulation and Instruction Set Simulator," IEEE Proceedings of the Sixth International Workshop on Hardware/Software Codesign, pp. 65–69 (Mar. 1998).*

Mascarenhas et al, "ParaSol: A Multithreaded System for Parallel Simulation Based on Mobile Threads," pp. 690–697 (Dec. 1995).*

"Spec–Based Verification", *Verisity Designs, Inc.*, http://www.verisity.com/html.specbased.html, pp. 1–17, (1999).

Abts, D., et al., "Verifying Large–Scale Multiprocessore Using an Abstract Verification Environment", *Proceedings of the 36th Annual Design Automation Conference*, pp. 1–10, (1999).

Chapiro, D., "The Next Frontier: High–Level Functional Verification", *Integrated Systems Design Magazine*, http://www.isdmag.com/Editorial/1997/Viewpoint9704.html, pp. 1–2, (1997).

Eiriksson, A., et al., "Origin System Design Methodology and Experience: 1M–gate ASICs and Beyond", *COMPCON–97*, Silicon Graphics, Inc., Mountain View, CA, pp. 1–8, (1997).

Jones, K.D., et al., "The Automatic Generation of Functional Test Vectors for Rambus Design", *Proceedings of the 33rd Annual Design Automation Conference*, pp. 415–420, (1996).

Subrahmanyam, P., "Functional verification finds a good friend in Vera", *TechWeb*, http://techweb.com/se/directlink.cgi?EET19970609S0083, pp. 1–4, (1997).

* cited by examiner

*Primary Examiner*—Samuel Broda
(74) *Attorney, Agent, or Firm*—Schwegman, Lundberg, Woessner & Kluth, P.A.

(57) ABSTRACT

A system and method of verifying an electronic system. A verification kernel is provided and the electronic system is expressed as a logic design. A wrapper is defined, wherein the wrapper is an interface between the logic design and the verification kernel. Tests to be run against the logic design are placed within a diagnostic program and an interface between the diagnostic program and the verification kernel is defined. The tests are then executed against the logic design. The results of the tests are captured and validated against expected results.

40 Claims, 19 Drawing Sheets

```
`timescale 1ns/100ps
module rtr_wrapper;

wire [19:0] Astmc, Artmc, Bstmc, Brtmc;
wire [19:0] Cstmc, Crtmc, Dstmc, Drtmc;
wire [7:0] miscin, miscout;
wire Astall, Bstall, Cstall, Dstall;
wire rst, clk;

initial begin
    clk = 0;
    forever #5 clk = ~clk;
end rtr_top
    top(Astmc, Artmc, Bstmc, Brtmc, Cstmc, Crtmc, Dstmc, Drtmc,
        miscin, miscout, rst, clk);
```

*Fig. 9A*

```
rtr_stub Atmc_stub(0, Astmc, Artmc, Astall, rst, clk);
rtr_stub Btmc_stub(2, Bstmc, Brtmc, Bstall, rst, clk);
rtr_stub Ctmc_stub(4, Cstmc, Crtmc, Cstall, rst, clk);
rtr_stub Dtmc_stub(6, Dstmc, Drtmc, Dstall, rst, clk);

raven_apply_change #(1) Astall_stub(8, clk, Astall);
raven_apply_change #(1) Bstall_stub(9, clk, Bstall);
raven_apply_change #(1) Cstall_stub(10, clk, Cstall);
raven_apply_change #(1) Dstall_stub(11, clk, Dstall);

raven_apply_change #(1) miscin_stub(12, clk, miscin);
raven_verify_change #(1) miscout_stub(13, clk, miscout);
raven_apply_change #(1) rst_stub(14, clk, rst);

endmodule
```

*Fig. 9B*

```
module rtr_stub(port, stmc, rtmc, stall, rst, clk)

input [31:0] port;
output [19:0] stmc;
input [19:0] rtmc;
input stall, rst, clk;
wire sak, rak;

rtr_xmtr xmtr(port, stmc, sak, rak, rst, clk);
rtr_rcvr rcvr(port + 1, rtmc, sak, stall, rst, clk);

endmodule
```

*Fig. 10*

```
module rtr_xmtr(port, stmc, sak, rak, rst, clk)

input [31:0] port;
output [19:0] stmc;
input [1:0] sak, rak;
input rst, clk;
wire [31:0] data;
wire [1:0] vc;
wire p, t, valid;
wire [3:0] block;

raven_apply_channel #(33,2)
  raven(port, clk, {p, data}, vc, t, valid, block, 1);

// Decode virtual channels
wire go0 = valid & (vc == 0);
wire go1 = valid & (vc == 1);
wire go2 = valid & (vc == 2);
wire go  = go0 | go1 | go2;

// Encode the transmitted flit. Ensure idle output while reset
// is in progress (rak is already reset clean from receiver).
reg [37:0] out;
always @(rst or go or rak or p or t or vc or data)
  if (!rst && go)
    out = {rak, p, t, vc, data};
  else
    out = {rak, 1'b0, 1'b0, 2'h3, 32'h00000000};
```

Fig. 11A

```
// Disassemble the flit based on the phase of the clock.
stmc = clk ? out[37:19] : out[18:0];

// Decode remote acknowledges.
wire ak0 = (sak == 0);
wire ak1 = (sak == 1);
wire ak2 = (sak == 2);

// Track the free buffer space at the remote receiver.
rtr_free free0(block0, go0, ak0, rst, clk);
rtr_free free1(block1, go1, ak1, rst, clk);
rtr_free free2(block2, go2, ak2, rst, clk);

// Assemble the virtual channel blocks.
assign block = {1'b1, block2, block1, block0};

endmodule
```

*Fig. 11B*

```
module rtr_free(block, go, ak, rst, clk)

output block;
input go, ak, rst, clk;
reg[3:0] free;

// Initialize free count at reset.
// Decrement free count when transmitting and increment when
// being acknowledged.  If both happen simultaneously, net
// result is to do nothing.
always @(posedge clk)
    if (rst)
        free <= 8;
    else if (go && !ak)
        free <= free - 1;
    else if (!go && ak)
        free <= free + 1;

// Block when no space left.
assign block = (free == 0);

endmodule
```

Fig. 12

```
module rtr_rcvr(port, rtmc, sak, rak, stall, rst, clk);

input [31:0] port;
input [19:0] rtmc;
output sak, rak;
input stall, rst, clk;
reg [37:0] in;
reg [31:0] data;
reg [1:0] ak, vc;
reg p, t, valid;
reg [1:0] buffer[0:31];
reg [4:0] bufferhead, buffertail;
wire empty, pop, push;

// Reassemble the flit based on the phase of clk.
always @(posedge clk)
    in[18:0] <= rtmc;
always @(negedge clk)
    in[37:19] <= rtmc;

// Decode the received flit.
always @(negedge clk)
    {ak, p, t, vc, data} <= in;
assign valid = !rst & (vc != 3);

// Propagate the remote receiver acknowledge back to the local
// sender. Filter any noise while reset is in progress.
assign sak = !rst ? ak : 3;
```

Fig. 13A

```
// Buffer the local acknowledge for the flit just received.
assign push = "rst & valid;
always @(posedge clk)
    if (rst)
        buffertail <= 0;
    else if (push) begin
        buffer [buffertail] <= vc;
        buffertail <= buffertail + 1;
    end
// Pull acknowledges from the other end of the buffer as
// long as they are not being stalled.
assign empty = (bufferhead == buffertail);
assign pop = "rest & "empty & "stall;
assign rak = pop ? buffer[bufferhead] : 3;
always @(posedge clk)
    if (rst)
        bufferhead <= 0;
    else
        bufferhead <= bufferhead + 1;

raven_verify_channel #(33,2)
    raven(port, {p, data}, vc, t, valid, 1'h0, 1);
endmodule
```

Fig. 13B

```cpp
include <raven/diagnostic.h> namespace mp {

// Port definitions
  const int AIN = 0;
  const int AOUT = 1;
  const int BIN = 2;
  const int BOUT = 3;
  const int CIN = 4;
  const int COUT = 5;
  const int DIN = 6;
  const int DOUT = 7;
  const int ASTALL = 8;
  const int BSTALL = 9;
  const int CSTALL = 10;
  const int DSTALL = 11;
  const int MISCIN = 12;
  const int MISCOUT = 13;
  const int RST = 14;

// Command definitions
  const int PUT = 0x0;
  const int GET = 0x1;
  const int ERROR = 0xf;

// Register definitions
  const int LUT = 0x0000;
  co nst int MISCIN = 0x1000;
  const int MISCOUT = 0x1004;
  const int LOCK = 0x2000;

// Define a 32 bit register with error flag.
  struct flit : public raven::reg<31,0> {
    raven::reg<0,0> err;
  };
```

Fig. 14A

```
  // Define a message, include all possible fields.
    struct msg {
      raven::reg<7,0> dest;
      raven::reg<7,0> src;
      raven::reg<3,0> cmd;
      raven::reg<3,0> mask;
      raven::reg<7,0> id;
      raven::reg<0,0> err;
      flit addr;
      raven::vector<flit> data;
      int vc;
      msg() {}
      msg(cost raven::bundle & other);
      operator raven::anybundle();
    };

// Define port encoding to accept a node and a location.
    struct port {
      int node, loc;
      port(int p) : node(p >> 8), loc(p & 0xff) {}
      port(int n, int 1) : node(n), loc(1) {}
      operator int() { return (node << 8) | (loc & 0xff); }
    };

// Make all kernel constructs visible.
    using namespace raven;
}

// Enable diagnostic line numbering.
#include <raven/lines.h>
```

*Fig. 14B*

```
static int
parity(const raven::reg & x)
{
    int p = 1;
    for (int i = 0; i < 32; i++)
        p ^= x[0](i);

return p;
} mp::msg::msg(const raven::bundle & x)
{
    // Decode head flit.
    dest = x[0](31,24);
    src  = x[0](23,16);
    cmd  = x[0](15,12);
    mask = x[0](11,8);
    id   = x[0](7,0);
    err  = x[0](32) ^ parity(x[0](31,0));
    vc   = x.vc;

// Decode address flit for request messages longer than a
    // single flit.
    int w = 1;
    if (vc == 0 && x.size() > 1) {
        addr = x[w](31,0);
        addr.err = x[w](32) ^ parity(x[w](31,0));
        w++;
```

Fig. 15A

```
  }
  // Decode data flits, if any.
  for (int i = w; i < x.size(); i++) {
    data[i- w] = x[i](31,0);
    data[i- w].err = x[i](32) ^ parity(x[i](31,0));
  }
} mp::msg::operator raven::bundle()
{
  raven::bundle<32,0> x;

// Encode head flit.
  x[0](31,24) = dest;
  x[0](23,16) = src;
  x[0](15,12) = cmd;
  x[0](11,8) = mask;
  x[0](7,0) = id;
  x[0](32) = err ^ parity(x[0]);
  err = (x[0](32) != parity(x[0](31,0)));

vc = x.vc;

// Encode address flit for request messages.
  int w = 1;
  if (vc == 0) {
    x[w](31,0) = addr;
    x[w](32) = err ^ parity(x[w](31,0));
    w++;
  }

// Encode data flits, if any.
  for (int i = 0; i < data.size(); i++) {
    x[i + w](31,0) = data[i];
    x[i + w](32) = err ^ parity(x[i](31,0));
  }
}
```

*Fig. 15B*

```
include <raven/mp.h> int
main()
{

// Write LOCK register.
mp::msg m;
m.cmd = PUT;
m.addr = LOCK;
m.data[0] = 0xdeadbeef;
m.vc = 0;
mp::apply(AIN, m, "Write LOCK request");

// Verify response and wait for completion.
m.data.length(0); // remove data but retain header information
m.vc = 1;
mp::verify(AOUT, m, "Write LOCK response");
mp::await("Write LOCK register response");

// Simultaneously read LOCK from all ports
m.cmd = GET;
m.vc = 0;
mp::apply(AIN, m, "Read LOCK request A");
mp::apply(BIN, m, "Read LOCK request B");
mp::apply(CIN, m, "Read LOCK request C");
mp::apply(DIN, m, "Read LOCK request D");
```

Fig. 16A

```
// Constructpossibile outcomes.
mp::msg yes, no;
yes.cmd = no.cmd = GET;
yes.addr = no.addr = LOCK;
yes.data[0] = 0xdeadbeef;
no.data[0] = 0;
int x;

// Possibility A
x = mp::verify(AOUT, yes, "Read LOCK response");
x = mp::verify(BOUT, no,  "Read LOCK response", x);
x = mp::verify(COUT, no,  "Read LOCK response", x);
    mp::verify(DOUT, no,  "Read LOCK response", x);

// Possibility B
x = mp::verify(AOUT, no,  "Read LOCK response");
x = mp::verify(BOUT, yes, "Read LOCK response", x);
x = mp::verify(COUT, no,  "Read LOCK response", x);
    mp::verify(DOUT, no,  "Read LOCK response", x);
```

*Fig. 16B*

```
// Possibility C
x = mp::verify(AOUT, no,  "Read LOCK response");
x = mp::verify(BOUT, no,  "Read LOCK response", x);
x = mp::verify(COUT, yes, "Read LOCK response", x);
    mp::verify(DOUT, no,  "Read LOCK response", x);

// Possibility D
x = mp::verify(AOUT, no,  "Read LOCK response");
x = mp::verify(BOUT, no,  "Read LOCK response", x);
x = mp::verify(COUT, no,  "Read LOCK response", x);
    mp::verify(DOUT, yes, "Read LOCK response", x);

// Await for finish.
mp::await("Read LOCK response");
mp::pass();
}
```

*Fig. 16C*

ABSTRACT VERIFICATION ENVIRONMENT

FIELD OF THE INVENTION

The present invention is related to testing of electronic and computing systems, and more particularly to a system and method for verifying large-scale computing systems using an abstract verification environment.

BACKGROUND INFORMATION

Modem electronic and computing systems have large numbers of subsystems, with millions of gates in each subsystem. Because of this, a minimal system simulation consisting of just a few of the subsystems results in a bloated and unmanageable verification environment. For example, modern scalable multiprocessors may have hundreds or thousands of nodes. Each node may include tens of millions of gates. Testing and verifying such a system quickly becomes difficult, impeding the design process.

Managing complexity in the verification process is not a new idea in the hardware design community. In the past, solutions have ranged from special-purpose cycle based simulators to, more recently, technologies such as formal verification (model checking and equivalence).

Contemporary multiprocessors such as the SGI Origin2000 have addressed these obstacles with innovative methodologies that include formal verification and traditional simulation. In "Origin System Design Methodology and Experience: 1M-gate ASICs and Beyond", COMPCON-97, Eiriksson et al. describe a high-level language used to test logic whose functionality can be described in terms of packets sent to or received from the logic. The language uses two basic commands: *_inject and *_expect. The *_inject command is used to send packets to the system under test. The *_expect command is used to receive packets from the system under test. In use, the * is replaced by a label associated with a particular stub in the configuration.

In the language described by Eiriksson et al., aspects of system behavior (such as packet format and handling) are hard-coded into the language. For each *_inject and *_expect command, the designer must specify the contents of the field of each packet; the definition of what fields comprise a packet depends on the particular stub to which the command applies.

The approach described by Eiriksson et al. suffers from a number of limitations. Since behavior is bard-coded in the language (i.e., primitives such as *_inject and *_expect are written to the behavior of the specific chip) such an approach is not easily ported to a new design. In addition, designers who wish to use this approach must learn a special-purpose language. Finally, the language is not robust or expansive.

Other large-scale projects, such as the Cray T3 E and the SGI SN1 (the follow-on to SGI Origin2000) have been verified through the use of very complex test benches constructed around logic modules, typically single chips. For example, the SN1 router chip test bench was written using a hardware description language (HDL) with the addition of C code to support self-checking diagnostics. The SN1 HDL was a combination of behavioral, RTL, and structural constructs used to define the router chip test bench. Directed and random diagnostics were written using this test bench. The heterogeneous verification environment of the SN1 router chip test bench, although effective, was, however, unnecessarily complex and cumbersome.

Various commercial tools are available for extending the capability of current logic simulators to address the ASIC/IC verification problem. Specman by Verisity Design provides an automated functional test generation environment from rules embodied in the design specification. (See, e.g., "Spec-based Verification: a New Methodology for Functional Verification of Systems/ASICs," a white paper published on the Verisity Design web page: http://www.verisity.com.)

System Science's VERA hardware verification language (HVL) provides an abstract test development environment that replaces the traditional HDL-based test benches with a special-purpose language used to describe self-checking diagnostics. (See, e.g., Mehdi Mohtashemi, "High-Performance Functional Validation," a System Science white paper available at http://www.systems.com/products/vera/vera.htm.)

Jones and Privitera use a formal specification to automatically generate functional test vectors for Rambus designs. (See, K. D. Jones and J. P. Privitera, "The Automatic Generation of Functional Test Vectors for Rambus Designs," Proceedings of the 33rd Annual Design Automation Conference, June 1996, p. 415–420. ) In a design formed with this approach, the formal specification completely describes the correct behavior of the device; Jones and Privitera use the formal specification to generate random and directed diagnostics using the RS language.

The RS description expresses an abstracted operational interface of the design as opposed to the logical structure of the device. Since the RS specification is not suitable for simulation it must be transformed into Verilog and simulated with a netlist of the device. Although this approach proved valuable for verifying Rambus DRAMs it is not likely to be effective for more general-purpose designs that don't exhibit a high degree of regularity.

The approaches used to-date have either been stop gap measures that quickly overcome by the increasing complexity of the systems being designed or have been special-purpose, hard-to-port, approaches with long learning curves. What is needed is a system and method for verifying logic designs which addresses the above-identified deficiencies.

SUMMARY OF THE INVENTION

According to one aspect of the present invention, a system and method of verifying an electronic system is described. A verification kernel is provided and the electronic system is expressed as a logic design. A wrapper is defined, wherein the wrapper is an interface between the logic design and the verification kernel. Tests to be run against the logic design are placed within a diagnostic program and an interface between the diagnostic program and the verification kernel is defined. The tests are then executed against the logic design. The results of the tests are captured and validated against expected results.

According to another aspect of the present invention, a logic verification system includes a hardware simulator, a diagnostic system, an interprocess communication mechanism for transferring stimulus from the diagnostic system to the hardware simulator and for transferring results from the hardware simulator to the diagnostic system, and a verification environment. The diagnostic kernel and the simulation communicate through the interprocess communication mechanism. The verification environment includes two or more layers of abstraction placed between a device being verified and a diagnostic program. One of the layers of abstraction is a verification kernel. The verification kernel includes a diagnostic kernel and a simulation kernel.

According to yet another aspect of the present invention, a system for simulating operation of an electronic device includes a hardware simulator, a diagnostic system and an interprocess communication mechanism for transferring stimulus from the diagnostic system to the hardware simulator and for transferring results from the hardware simulator to the diagnostic system. The simulator is capable of receiving connections and commands from a diagnostic program running on the diagnostic system, of executing the commands as directed and of returning results to the diagnostic system.

BRIEF DESCRIPTION OF THE DRAWINGS

In the following drawings, where like numeral identify similar function in each of the separate drawings:

FIG. 9 illustrates a logic design wrapper according to the present invention;

FIG. 10 illustrates a router communication channel stub;

FIG. 11 illustrates a router channel transmitter,

FIG. 12 illustrates a submodule for tracking the number of free buffer spaces on a single virtual channel;

FIG. 13 illustrates a router channel receiver;

FIG. 14 illustrates a diagnostic programming interface;

FIGS. 15a–c illustrate a DPI C++ source file; and

FIG. 16 illustrates a LOCK register test for the router.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As noted above, the verification problem is rooted in the exponential growth of integrated circuit (IC) technology. As design complexity and integration increase, the verification challenges are compounded. In the logic design process various types of abstraction are used to manage this complexity. For example, hierarchical design methods abstract much of the complexity from an ASIC design. In much the same way, abstraction can be used to effectively mask complexity and implementation details during the verification phase.

Figure 1:
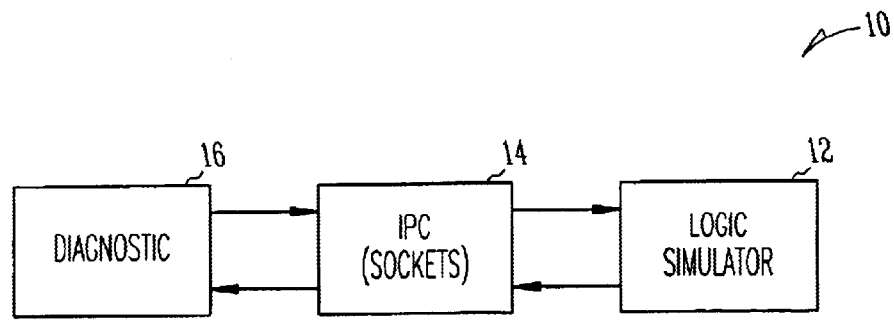
FIG. 1 is an verification system according to the present invention.

One embodiment of a verification system which uses abstraction to effectively mask complexity and implementation details during the verification phase is shown in FIG. 1. In FIG. 1, verification system 10 includes a hardware simulator 12 connected through an interprocess communication (IPC) mechanism 14 to diagnostic system 16. In one such embodiment, hardware simulator 12 and diagnostic system 16 are independent processes which execute concurrently on a multiprocessor. In another such embodiment, hardware simulator 12 and diagnostic system 16 are independent processes which time-share on a uniprocessor system. In either case, synchronization and communication can be accomplished via a communication mechanism such as sockets. By decoupling diagnostic system 16 and logic simulator 12, a client-server relationship is created between diagnostic system 16 and logic simulator 12, where the interprocess communication (IPC) mechanism (sockets) delivers the stimulus and returns the results from hardware simulator 12.

In one embodiment, verification system 10 uses a verification environment designed upon several layers of abstraction; the layers of abstraction mask the complexity and details of the logic design. This use of abstraction is analogous to an application program being abstracted from the actual physical hardware by several layers of operating system (API, user and system level calls, device drivers), or similarly, to a network application abstracted from the communication media by a communication protocol stack (e.g. layers of the OSI networking model). The logic design (usually RTL or gate-level HDL) of the design under test (DUT) is the nucleus of the verification environment.

Figure 2:
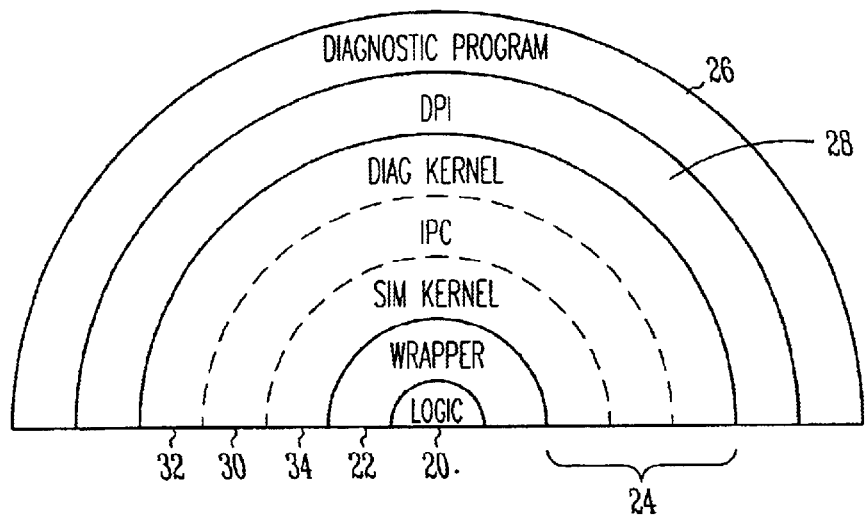
FIG. 2 illustrates a verification environment according to the present invention.

An example of such an approach is shown in FIG. 2. In FIG. 2, the verification environment includes the logic 20 of the system under test, a wrapper 22 wrapped around logic 20, a verification kernel 24, a diagnostic program 26 and a diagnostic program interface (DPI) 28. Wrapper 22 is the interface between logic 20 and verification kernel 24. Diagnostic program interface (DPI) 28 is the interface between diagnostic program 26 and verification kernel 24.

In one embodiment, logic 20 and wrapper 24 are compiled into an object file, which is linked with kernel 24 routines to create an executable logic simulator. In one such embodiment, inter-process communication (IPC) layer 30 provides the client-server interface between diagnostic program 26 and logic simulator 12. In one embodiment, kernel 24 includes a diagnostic kernel 32 and a simulation kernel 34 that lie on either side of IPC layer 30.

As noted above, the two halves of the simulation environment use the client/server model for interprocessor communication. The inner half of the simulation environment, simulator 12, acts as the server, and the outer half of the simulation environment, diagnostic 16, acts as the client. The server accepts connections and commands from diagnostic 16, runs the simulation as directed, and returns results back to diagnostic 16. At the end, diagnostic 16 can either detach and leave simulator 12 waiting for another diagnostic or terminate simulator 12. If simulator 12 is left running, the next diagnostic to attach continues in the simulation from where the previous diagnostic left off.

In one embodiment, system 10 is an extensible, abstract verification framework that augments traditional logic simulators, and is built upon standard C/C++ and a uniform diagnostic programming interface (DPI). Traditional discrete event logic simulators are leveraged where possible, as long as their use does not overly burden the verification engineer who is writing the diagnostic.

To accomplish this, a number of goals can be established for the verification environment. First, the approach should be scalability in order to allow verification at various levels, including sub-chip level, single-chip level, and multi-chip level. As the logic design matures, the verification environment must grow as well. It is unproductive to create "disposable test benches" at each phase of the logic design.

Second, the verification environment should leverage familiar and contemporary languages such as C/C++ for diagnostic development. These programming skills are commonplace in most engineering teams.

Third, the diagnostic should not be bound to the simulator. That is, it should be possible to quickly recompile diagnostics without rebuilding the simulator.

Fourth, the diagnostic should interact with the device under test (DUT) through a well-defined Diagnostic Programming Interface (DPI) to enhance diagnostic portability and ease-of-use.

Finally, the verification environment should provide automatic validation of functional and temporal properties. That is, stimuli are injected into the logic design and the response should automatically be validated against some expected results. For example, in one embodiment, an error condition causes the diagnostic to immediately terminate.

A hardware verification environment that encompasses the above five attributes provides a better framework for validating the correctness of future large-scale multiprocessors. One such verification environment will be discussed next.

In one embodiment, kernel 24 provides generic, low-level operations that are leveraged by the upper layers. Diagnostic programming interface layer 28 uses the kernel routines to present a very well-defined and uniform interface to the diagnostic (test) developer. In one such embodiment, diagnostic programs are written in C/C++ using DPI 28. In the embodiment shown in FIG. 2, each diagnostic test includes three major parts: a diagnostic program 26, a diagnostic programming interface 28 and a diagnostic kernel 32. In one such embodiment, each portion is written independently and only as necessary, thereby maximizing efficiency. The three parts are then linked together to form the complete diagnostic test. All three parts are written primarily in C++.

The other half of the verification environment is logic design simulator 12. Logic design simulator 12 also includes three parts: a logic design 20, a logic design wrapper 22 and a simulation kernel 34. Again, in one such embodiment, each portion is written independently and only as necessary and linked together to form the complete simulator.

In one embodiment, the primary data object used by system 10 is an event. An event is a very generic term used to describe two types of activities: signal transition (wiggle), and a sequence of signal transitions (bundle). A wiggle corresponds to a singular signal transition, whereas a bundle refers to an aggregate of transitions.

In one embodiment, diagnostic program 26 is simply a program that the end design verification engineer writes to exercise a hardware design. The diagnostic is the outermost layer of environment and is the most abstract. Diagnostic 26 interacts with the design using diagnostic programming interface 28. Diagnostic 26 will execute in parallel with simulator 12 and, as a result, diagnostics that consume more computer resources than simulator 12 will slow simulation down by the difference. However, this is significantly better than other verification environments where the simulator is always slowed by the total diagnostic execution time.

Diagnostic programming interface 28 is a program library that a single design verification engineer writes that adapts the system 10 diagnostic interface to the logic design specific interface. The adaptation consists of building more abstract data structures to match structures natural to the logic design and of overloading system 10 functions to accept the abstract data structures. The overloaded functions convert between the abstract data structures in the system 10 data structures and call the system 10 functions. The diagnostic programming interface only needs to be written once for a particular design and all diagnostics are written using this single interface.

Diagnostic kernel 32 is a program library that contains functionality common to all diagnostics. Diagnostic kernel 32 operates on the extremely generic structures, wiggles and bundles, that are adaptable to virtually any hardware architecture. Functionality exists in the kernel to send input to the simulator, to receive output from the simulator and automatically verify the correctness, to wait for specific actions to complete and to communicate with the simulation kernel. System 10 also provides miscellaneous functionality to support diagnostic programming parallelism, direct access to simulator signals, two and four state registers, output logging and cross platform portability. Diagnostic kernel 32, UPC layer 30 and simulation kernel 34 make up kernel 24.

Simulation kernel 34 is a program library that contains functionality common to all simulations. The simulation kernel operates with the same generic structures on which the diagnostic kernel operates. Functionality is minimal in the simulation kernel, but functionality does exist to make connections to hardware wrapper 22 and to communicate with diagnostic kernel 32. The actual queues used to deliver input at the appropriate time and to capture output reside in simulation kernel 34 to make better use of interprocess communication channel 30.

Logic design wrapper 22 is a Verilog module that a single design verification engineer writes. Logic design wrapper 22 adapts simulation kernel 34 to a logic design. The adaptation consists of building the necessary logic to terminate all signals that are connected to system 10. Communication channels need to have the appropriate receivers, transmitters and flow control mechanisms attached; all other signals are typically terminated with filters and registers. More complicated structures in hardware wrapper 22 are also legitimate to do things like ignore output values during reset or to fulfill any other hardware requirements. However, the amount of code in hardware wrapper 22 should be minimized keep simulation speed maximized.

Logic design 20 is, of course, the design being tested. Logic design 20 can be any size from a single module to a full system with multiple chips, but system 10 performs most efficiently with larger design. With small designs, interprocess communication latency, although it is quite small, can tend to dominate and make system 10 appear to slow down the simulation. In large designs (e.g., fill chips), the interprocess communication latency becomes negligible since it is hidden within the time spent simulating. This trade-off is considered more than acceptable since system 10 is designed to deal with more complicated structures like communication channels, which are more typically at the single chip level, and other, larger, simulations. Furthermore, even with the losses experienced in testing small designs, the present system still yields simulators that run more than fast enough.

In one embodiment, the Synopsys VCS v4.1.1 logic simulator is used to compile Verilog RTL source code into an object file. The object code is then linked with the verification system 10 kernel routines using gcc v2.90.29 (using the EGCS v1.0.3 distribution). Kernel 24 was compiled using g++ and is, therefore, supported on a variety of hardware platforms. The −O3 compiler optimization was used to compile the Verilog RTL, kernel 24 and diagnostic program 26.

Since verification system 10 decouples diagnostic 16 and logic simulator 12, it can execute on a uniprocessor, multiprocessor, or on separate machines in a distributed computing environment. The systems used for logic simulation and for executing verification system 10 diagnostics include distributed shared memory systems such as the SGI Origin2000 (a distributed shared memory (DSM) machine with 16 MIPS R10000 (195 MHZ) processors, each with a 32 Kbyte primary instruction and data cache, a unified 4 Mbyte secondary cache, and total of 4 Gbytes of main memory, using IRIX 6.4) and uniprocessor machines such as the SGI Indigo2 (a uniprocessor machine with a MIPS R1000 (195 MHZ) processor with a 32 Kbyte primary instruction and data cache, a unified 1 Mbyte secondary cache, and 128 Mbytes of main memory, using the IRIX 6.2 operating system).

Data Types

Verification system 10 deals with abstract features of logic designs and requires special data types to contain some of these features. Ordinarily, these special data types would require a custom programming language, but C++ comes to the rescue with user definable data types called classes. These user defined data types, if properly constructed, can be used just like the built in data types in variable declarations an in expressions. The result is the ability to use a standard programming language like C++ for diagnostics with extensions to handle the simulation specific features.

For example, in one embodiment verification system 10 extends the ANSI C/C++ basic data types (char, int, long, float, double) with data types needed to support hardware designs having the two-state and four-state values that are common in most HDLs. In addition, several compiler macros are used to make the new types platform independent.

Verification system 10 also introduces the use of portable integers. Heterogenous computing environments are very common resources; unfortunately the standard C++ integer types int, short, and long can vary from one compiler and hardware platform to the next. On most workstation or server-class machines, a short is 16-bits and both int and long are 32-bits. At the same time, a number of machines use a 64-bit compiler in which a short is 16-bits, an int is 32-bits and a long is 64-bits. On the other hand, on some machines (e.g., those manufactured by Cray Research, a subsidiary of Silicon Graphics, Inc.), short, int and long are all 64-bits. To prevent compatibility problems, in one embodiment verification system 10 introduces a big data type (defined as a 64-bit integer) that is independent of the hardware platform.

In some embodiments, verification system 10 and diagnostic programming interface 28 have a need for a special array in which one does not have to worry about memory allocation. This need occurs because arrays are required, but the length of these arrays may be unknown since it is the diagnostics that provide the length. As a means to an end, system 10 provides a C++ template named group that allows the definition of automatic arrays. These arrays are used by system 10 in the definition of a bundle them by DPI 28 in the definition of logic design specific event types.

A group is declared using the normal C++ template mechanisms. For example, the group of integers would be defined as:

group<int>x;

A group is used just like a normal array, except one does not need to worry about how big the array really is, since it will grow as necessary. For example:

```
group<int> x ;
for(int I = 0; I < 143; I++)
    x[i] = I;
```

Array growth is automatic, but sometimes the array needs to be reduced if it is consuming too much memory and many locations are no longer needed. Array reduction is a manual process accomplished with the length function. Once reduced, the contents of the truncated array elements are gone forever. A length function can also be used to determine how large a group has grown. The prototypes for the length function are:

unsigned group <type>:: length ( ) const;

void group <type>:: length (unsigned size);

The following code example demonstrates that use the length member function:

```
group<int> x ;
for (int I = 0; I < 143; I++)
    x[i]= I ;
cout << x.length( ) << endl;    //will print 143
x.length(33);                    // shrink to 33 elements
```

Verification system 10 also introduces the use of two-state variables. It is common in hardware designs to come across signals that are larger than the standard integer types. Verification system 10 simplifies the use of large data values by providing an arbitrarily large num type. (In one embodiment, nums can be arbitrary sizes. In one such embodiment, the num class sets the maximum size to 128 bits; this size can, however, be increased if it is found to be too restrictive.)

In one embodiment, system 10 provides the num class for holding large two state unsigned quantities. The num type closely follows the rules of the standard int type except that none of the standard modifiers like unsigned, signed, const, and volatile can be used in conjunction with a num. Verification system 10 provides the NUM macro for specifying num literals. A variable of type num is declared as follows:

num a;
numb=1;
num c=NUM(0xdeadbeef);

In one embodiment, verification system 10 includes four-state variables. The normal C++ data types are insufficient for holding simulation signals. They are only capable of containing two state signals of relatively small size, typically 32 or 64 bits. Simulation signals are very often larger than this and in modern simulation platforms, the signals are more often four state variables. System 10 provides the reg data type for holding unsigned four state signals. (In one embodiment, both regs and nums are arbitrary sizes. In one such embodiment, both the num class and the reg class set the maximum size to 128 bits; as noted above, this size can, however, be increased if it is found to be too restrictive.)

In one embodiment, the reg data type provides a portable (machine independent) 256-bit four-state value with a comparison mask. The reg type is the standard type for holding simulation values. The reg type also has a REG macro that takes a four-state literal. The literal uses the standard format prefixes of either C++ (0x for hexadecimal, O for octal), or Verilog HDL ('h for hexadecimal,'o for octal, 'd for decimal, 'b for binary). In one embodiment, the literal is made up of valid digits for the base, along with unknowns (x or X) and high-impedance (z or Z) values. For clarity, the underscore "_" character can be included in the literal as a separator.

In one embodiment, the reg data type is a data structure containing three subfields as follows:

```
class reg {
public:
    num v, x ;
    num mask ;
};
```

The v and x fields combined hold the four state value of the signal. One bit from each of the two fields corresponds to the same bit in the four state value. The four state encoding is identical to that used in Verilog simulators. A variable of type reg is declared as follows:

reg a;
reg b="'b 1111 0000 xxxx zzzz";
reg c=REG(0x123456789 abcdef);

In one embodiment, the v and x fields can be accessed; both fields are, however, update when a reg variable is assigned a new value.

All the arithmetic, logical, bit-wise, and relational operators work the same on reg types as they do on standard integers. For instance, it is perfectly legal to perform (given the above variable declarations): a=b+c ;. Some operations, however, may not make sense on four-state variables, such as greater-than and less-than relational operators. If either variable contains x's or z's, the result would be undefined. In such cases, system 10 follows the convention of producing the same results as Verilog would have in similar circumstances.

Each reg also has a mask field to identify significant bits used when applying stimulus or validating results. The mask field is logically and-ed with the data before being applied or verified, effectively ignoring the non-significant portions. The user must set this mask accordingly to prevent false error detection; that is, the case where a diagnostic fails because bits of a register that are uninteresting are being compared. By default, all bits of a reg value are considered significant, unless instructed otherwise by an assignment to the mask field of a reg type variable.

In one embodiment, the mask field is simply along for the ride and is not significant in any reg type operations. Instead, the mask field is used by some system 10 functions for function specific operations. In such an embodiment, the mask field is only modified when a reg variable is assigned a new value for a reg value. The following code example demonstrates how to access the subfields of a reg variable:

reg a_variable;
a_variable.mask=-1; // set all bits

In general, if either operand of a reg operation contains unknown or high-impedance bits, all the bits in the result will be unknown, except for the exceptions provided for four state operations in Verilog. Unknown or high-impedance bits in a reg being bitwise shifted, will move just as normal zeros and ones. Unknown or high-impedance bits in the shift amount result in all the bits in the result being unknown. Relational operations will always result as false if either operand contains unknown or high-impedance bits.

In one embodiment, verification system 10 includes data types defining signal transition events. For instance, in one embodiment, the wiggle data type contains information to describe a signal transition. The wiggle type is the atomic unit for building more abstract types and is defined as follows:

```
class wiggle : public reg {
public:
    big delay ;
    big time ;
};
```

The semantics of the delay field depends on whether the signal is an input or an output of the simulator. If the signal is being applied as stimulus, then the delay field contains the minimum number of clock periods the signal will be delayed before being applied to the simulation. Otherwise, for a simulator output signal, the delay field is the number of clock periods that passed since the last output from the simulator. The time field is assigned by kernel 24 as a time-stamp of the simulation time when the event is applied to or captured from simulator 12.

Similarly, verification system 10 includes message events. The bundle data type is a group {wiggle} plus a virtual channel, and encapsulates all the necessary information to describe a message. The bundle abstraction can be thought of as a dynamically sized group of wiggles. A message then, is a sequence of wiggles occurring on some communication channel.

Finally, the packet type is an abstraction of the bundle type, and can be viewed as a logical sequence of flow control units (flits) on a communication channel. For example, in one embodiment, a packet, P, is defined as:

P={head, body*} where head is a flit describing the start of packet P, and body is zero or more flits of payload for the packet. Other packet formats could also be used. The packet format is governed by a user-defined communication protocol.

Diagnostic Programming Interface

Diagnostic programming interface 28 provides the verification engineer with a high-level abstraction of the hardware design. DPI 28 makes extensive use of events as either arguments or as return values of DPI primitives.

Verification system 10 formally defines an event using the 5-tuple

E=(node, location, name, event-id, type)

where node is the node-id of a node in a multi-node system simulation (defaults to node 0 for unit-level or chip-level simulations), location specifies the interface in the simulation at which the event is associated, name is a string to identify the event, event-id is a unique event number which is assigned by kernel 24 to identify an event, and type is either wiggle, bundle, or packet.

The apply primitive is used to create an event for delivery to the simulation. The apply primitive will submit an event to kernel 24 for simulation. The basic form for apply is:

event-id=apply(event);

where event is the event to be applied as stimulus to simulator 12, and event-id is a unique numeric identifier of the event. The apply operation is non-blocking, so diagnostic execution continues with the next sequential instruction in the diagnostic program.

The verify primitive is used as the apply counterpart to validate results from logic simulator 12. The verify operation attempts to match the expected event with the actual event received from the simulation. In one embodiment, if a mismatch is detected during automatic verification, the diagnostic will display the error trace and terminate. The general form for verify is:

event-id =verify(event);

The verify operation returns a unique numeric identifier of the expected event, which can subsequently be used for event synchronization (verify, like the apply primitive, is a nonblocking operation).

In one embodiment, an unexpected event (one for which there is no outstanding verify) is also treated as an error condition.

Also, in one embodiment verification system 10 provides a user-definable timeout value used to detect errors caused by indefinite postponement.

Figure 3:
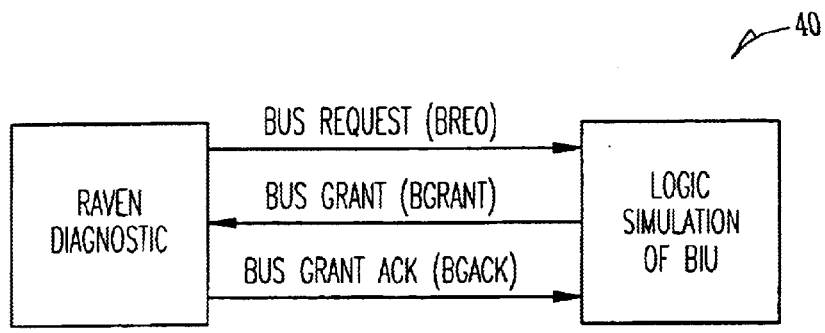
FIG. 3 shows a verification system for a bus interface unit.

In one embodiment, verification system 10 provides for explicit synchronization. Often a hardware design will behave according to some protocol or interface that is reasonably well defined. For instance, consider a bus interface unit (BIU) 40 in FIG. 3. BIU 40 is responsible for implementing the bus-level interface to a microprocessor. This interface requires some handshaking protocol for devices that wish to use the bus. To request the bus a device will issue a bus request (BREQ), and wait for a bus grant (BGRANT) response from the microprocessor. After receiving a BGRANT, the device will issue a bus grant acknowledge (BGACK) to inform the microprocessor that it successfully received control of the bus.

A simple verification system 10 diagnostic to validate this behavior is given below.

apply(BREQ);
verify(BGRANT);
await(BGRANT);
apply(BGACK);

Each of the events in this simple example would be a signal transition event, or wiggle. Since apply and verify primitives are non-blocking it is necessary for the user to specify explicit synchronization points to resolve any dependencies among events. The await operation provides a barrier-like synchronization among events. In the example shown above, it is necessary for the diagnostic to await the arrival of the BGRANT event prior to applying a BGACK. The await primitive is a blocking operation that causes diagnostic thread of execution to halt until the event of interest has occurred.

In one embodiment, verification system 10 provides for handling spurious events. During verification it is often essential to capture speculative events that may occur during the course of the simulation. These spurious events can be very difficult to detect using traditional simulation techniques. However, in one embodiment, verification system 10 provides a very flexible mechanism for handling these occurrences.

The trap operation allows a user to define a handler routine which is invoked if an exception occurs. For example, after reset is performed by a chip it is undesirable for another reset to occur unexpectedly. The following verification system 10 diagnostic will detect this anomaly.

/* preamble */
...
apply(TOGGLE_RESET);
verify(RESET_COMPLETED);
await(RESET_COMPLETED);
trap(RESET_ASSERTED, reset error( );
...
/* continue with diagnostic */

In this simple example, the TOGGLE_RESET event causes the appropriate reset input pins to be asserted. A check is made to verify that the reset operation actually occurs, by verifying and awaiting the RESET_COMPLETED event. Finally, we use the trap operation to catch an unexpected reset and invoke the users reset error routine if detected.

It is important to note that the diagnostic doesn't terminate when an event triggers the trap primitive. Verification system 10 merely notifies the diagnostic of the occurrence, similar to how the Unix operating system notifies a user process using signals.

In one embodiment, verification system 10 provides for thread-level parallelism. Instances of identical replicated components are common in modem hardware designs (e.g., a communication switch with four identical input/output ports). It is desirable in such a situation to write a single diagnostic routine and apply it to each of the component instances in parallel. Moreover, the ability to concurrently apply stimuli to multiple components accurately models real-world applications.

The Verilog HDL provides fork and join operations to create the appearance of parallel threads of execution within the simulation. However, using these operations to write even modestly complex diagnostics is non-trivial.

Similarly, POSIX threads (pthreads) offer another method of parallel execution. Unfortunately, pthreads are limited to a relatively small number of child processes. Moreover, use of pthreads would make a logic simulation environment non-reproducible. That is, if an error in the design is discovered using a pthreads approach it would be difficult, if not impossible, to recreate the circumstances that exposed the error.

In one embodiment, verification system 10 uses parallel and merge primitives to provide diagnostic thread-level parallelism. The general form for the parallel and merge operations is as follows:

parallel(user routine, args);
merge( );

The parallel operation creates a new diagnostic thread beginning execution with the first line of code in a related user routine. Any number of threads may execute concurrently. Verification system kernel 24 manages the execution of all diagnostic threads, providing cooperative multitasking among the parallel diagnostic threads. The merge operation blocks execution of the parent diagnostic thread until all its child parallel threads have completed.

For example, consider a four port communication switch and the following diagnostic:

```
void send msg(int port num)
    for (I=0; I < NUM_MESSAGES_TO_SEND; I++)
    ...
        MESSAGE.location = port num ;
        apply(MESSAGE) ;
        verify(MESSAGE_COMPLETE) ;
        await(MESSAGE_COMPLETE) ;
        ...
    }
    return 0 ;
} /* end of send msg routine */
/* parent diagnostic */
parallel(send_msg, port0) ;
parallel(send_msg, port1) ;
parallel(send_msg, port2) ;
parallel(send_msg, port3) ;
merge( ) ;
/* wait for all threads to complete */
```

The above diagnostic creates four identical diagnostic threads, one for each communication port. In this example, the send_msg routine sends a predetermined number of messages to a specific port. The merge operator in the parent diagnostic blocks execution until all parallel diagnostic threads have completed.

In one embodiment, verification system 10 provides a mechanism for validating nondeterministic design behavior.

It is customary to design very deterministic, predictable, well-behaved logic designs. However, there are occasions when nondeterministic behavior is preferred. Consider a four port communication switch that uses adaptive routing to circunvent a congested path. In such a device, a packet arrives at an input port and the communication switch arbitrates among several possible output ports to route the outgoing packet. This behavior is particularly difficult to validate, since the verification engineer may not really know which output port will be chosen. All that is known is that one of the output ports will be chosen.

To validate nondeterministic behavior, in one embodiment verification system 10 provides a special form of the verify(event) and await(event) DPI primitives. When the DUT is expected to produce one out of n possible outcomes, system 10 verifies each of the n possibilities, providing the same event name to each of the events being verified. System 10 then uses the await primitive to await the nondeterministic outcome from the design. In such an embodiment, the await primitive returns the event that was the outcome of the nondeterministic behavior.

This idea can be best illustrated with a simple example. Consider a diagnostic to validate the four port communication switch with adaptive routing described earlier.

```
packet IN_PACKET ;
packet OUT_PACKET ;
packet CHOSEN ;
IN_PACKET.location = port0 ;
apply(IN_PACKET) ;
OUT_PACKET.location = port1 ;
verify("output", OUT_PACKET) ;
OUT_PACKET.location = port2 ;
verify("output", OUT_PACKET) ;
```

-continued

```
OUT_PACKET.location = port3 ;
verify("output", OUT_PACKET) ;
CHOSEN = await("output") ;
switch(CHOSEN.location)
{
    case 'port1': . . .
    case 'port2': . . .
    case 'port3': . . .
}
...
```

The above diagnostic will inject a packet into port0 of the communication switch. Then, it expects the output to occur on one of the three output ports (port1, port2, or port3). The OUT_PACKET event is verified at each of the possible port locations. The named event "output" binds the three OUT_PACKET events. Then, system 10 awaits the results from the design under test. The await operation returns the event which satisfied the nondeterminism, in this case, the output port which was chosen.

In one embodiment, verification system 10 provides DPI primitives for such things as:

setting the timeout value for a diagnostic (timeout) (the scope of timeout can be the entire diagnostic, an individual event, or an interface (port) on the design);

controlling the verbosity of debugging and error trace messages (debug);

reading and setting a value of a signal anywhere within the logic design (sample and deposit, respectively) (can be used for polling a bit within a register, for example);

writing and reading the contents of a memory (fill and extract, respectively);

logging output to a file (log); and terminating a diagnostic (quit).

Although these miscellaneous DPI primitives are very useful, further exposition is unwarranted since the semantics of these operations are intuitive and common to many HDLs.

Diagnostic Flow and Control

Verification system 10 places some requirements on diagnostics to properly start and stop to ensure that verification system 10 is properly initialized and properly terminated. Failure to start and stop diagnostics correctly will produce undefined results. Ideally, these steps would be optional so that diagnostics would always work as expected, but limitations of C++ force these requirements. While starting and stopping diagnostics involves required functions, verification system 10 provides some other optional flow control functions. These functions allow diagnostics to select the output verbosity level and allow diagnostics to obtain the current simulation time.

In one embodiment, before any system 10 functionality can be used, diagnostics must call the function diagnostic. A call to diagnostic initializes verification system 10, establishes a connection to simulator 12, and configures a diagnostic programming interface clean up function. The diagnostic function prototype is:

void diagnostic(const char * title, void (* finish)( )=0);

Diagnostics are given a title with the argument title. A title is simply a string that is put into the log files of both the diagnostic and simulator 12 for reference. A pointer to a function that will be called just before verification system 10 terminates is supplied in the optional argument finish. This function must take no arguments and return no value. Failure to supply a function matching this prototype will result in a compiler error. This clean up function is intended to be used by diagnostic programming interfaces to display statistics or do anything else required before shutdown. If finish is null, which is the default value when the argument finish is omitted, then no function will be called when verification system 10 terminates.

The following example code demonstrates how one way to initialize a diagnostic with diagnostic:

```
const char * title = "My Little Diagnostic Program";
void finish( ) {
   log << title << "is done!" << endl;
}
int main( ) {
diagnostic(title, finish);
}
```

In one embodiment, error messages corresponding to the exception being thrown are always displayed and can not be disabled.

Exceptions are a C++ mechanism for handling exceptional conditions like errors. As such, system 10 uses exceptions as the mechanism for handling exceptional errors. Errors not considered exceptional include event comparison errors (discussed below). A knowledge of C++ exceptions is not required for writing diagnostic programs or diagnostic programming interfaces. Exceptions, however, do provide a more skilled programmer the ability to control diagnostic flow following an error condition.

In one embodiment, exceptions that are caught are not used to terminate a diagnostic. Instead, diagnostics are free to take other action. Catching exceptions can be used by smart diagnostics to recover from unexpected conditions like time outs. While a full discussion of exceptions is beyond the scope of this document, a brief overview will be supplied.

Exceptions are caught by surrounding the code that might throw an exception with a try block and immediately following the try block with a catch block that contains the recovery code. For example:

```
intmain( ) {
   try {
      do_something( );
   }
   catch (exception & ex) {
      handle_an_error( );
   }
}
```

The catch block is only executed if an exception is thrown in the preceding try block. Notice that the catch command takes an argument which will make the catch block only sensitive to system 10 generated exceptions.

Exceptions that are not caught in diagnostic code are caught by system 10. In one embodiment, system 10 configures a terminate handler that is called by C++ whenever an exception is not caught. In such an embodiment, diagnostics and diagnostic programming interfaces must not set a new terminate handler unless their new handler arranges to call the system 10 terminate handler. The following example code demonstrates how this is accomplished:

```
void (* raven_handler)( );
void dpi_handler( ) {
   // do dpi work
   raven_handler( );
}
int main( ) {
   raven_handler = set_terminate(dpi_handler);
}
```

Note that, in one embodiment, the system 10 terminate handler calls the finish function specified with the diagnostic function. This is one method for arranging for a diagnostic programming interface clean up function to be called. This method should only be used when an exception creates an unique situation that must be handled differently than normal diagnostic termination.

In one embodiment, the diagnostic function can throw a multiply_called exception to indicate that an error has occurred. The multiply_called exception indicates that the function has been called more than once. This function can only be called one time.

In one embodiment, simulation time is available through a moment function. The moment function is non-blocking and returns immediately. No implicit context switch occurs within moment. The moment function prototype is:

unsigned big moment( );

The moment function returns the current simulation time. The units of time are the same units of time used in the logic design wrapper, which is the first number in a Verilog timescale directive.

In one embodiment, the moment function throws a not initialized exception to indicates that verification system 10 has not been initialized. Verification system 10 requires that diagnostic be called before any other system 10 functions to initialize data structures and initiate communication with the simulator.

As in initializing diagnostics, error messages corresponding to the exception being thrown are always displayed and can not be disabled.

The following example code demonstrates how to get the current simulation time with diagnostic:

unsigned big current_time=moment( );

Sometimes, like when writing and debugging a diagnostic, it's handy to have more verbose output so diagnostic progression can be observed. At other times, like when running a regression test, it's faster to have less verbose or no output. In one embodiment, verification system 10 allows the diagnostic to select the level of output with the debug function. The debug function is non-blocking and returns immediately. No implicit context switch occurs within debug. The debug function prototypes are:

void debug(unsigned big flags);
unsigned big debug( );

The different outputs are selected by enabling bits in the argument flags. The debug function returns the current flags in effect. Bits 32 through 63 are predefined by system 10, but bits 0 through 31 are unused by system 10 and free to be defined by diagnostic programming interfaces. Diagnostic programming interfaces should still be sensitive to the predefined bits if new event handlers are configured. In one embodiment, the following predefined debug flag bits control output:

DEBUG_APPLIES (bit 59): This flag enables the display of all delivered events as soon as they are completely delivered.

DEBUG_MATCHES (bit 58): This flag enables the display of all automatically verified and trapped events including the actual event, the expected event, and any unused possibilities.

DEBUG_CALLS (bit 52): This flag enables the display of most verification system 10 function action including the parameters passed into and out of the function and the results of the function.

DEBUG_CLOCKS (bit 51): This flag enables the display of the simulation time, which will be updated occur on each port clock edge.

DEBUG_THREADS (bit 49): This flag enables the display of thread context switches.

The debug function can throw a not_initialized exception to indicate that system 10 has not been initialized. Verification system 10 requires that diagnostic be called before any other system 10 functions to initialize data structures and initiate communication with simulator 12.

The following example code demonstrates how to set and get the current debug flags with debug:

```
debug(DEBUG_CALLS|DEBUG_THREADS); // set flags
unsigned big f=debug( ); // get flags
debug(DEBUG_MATCHES|debug( )); // add some flags
debug(~DEBUG_THREADS & debug( )); // remove some flags
```

Diagnostics have to be terminated correctly to ensure that system 10 correctly cleans up. This can be accomplished by stopping simulator 12, if necessary, and calling the diagnostic programming interface clean up functions. Diagnostics stop with the pass function, the f ail function or the leave function. The pass, fail and leave function prototypes are:

```
void pass( );
void fail(int status=1);
void leave( );
```

One of these diagnostic stopping functions must be called by the function main; any may be called by any other thread. Threads that do not call any of these diagnostic stopping functions, but instead return naturally, behave as if they called pass. If all threads call pass or return naturally, the diagnostic will display the word PASS, terminate simulator 12 and terminate itself with an exit code of zero after all threads have completed. If all threads call leave and the rest call pass or return naturally, the diagnostic will not terminate the simulator but terminate itself with an exit code of zero after all threads have completed. Another diagnostic can attach and continue where the last one left off.

If any thread calls fail and the rest call leave, pass or return naturally, the diagnostic will display the word FAIL, terminate simulator 12 and terminate itself with an exit code equal to the fail argument status without waiting for all threads to complete.

The pass, fail and leave functions can throw a not_initialized exception to indicate that system 10 has not been initialized. Verification system 10 requires that diagnostic be called before any other system 10 functions to initialize data structures and initiate communication with simulator 12.

Concurrent Programming

Concurrent programming is a technique that structures a program such that portions can execute independently from and simultaneously with each other. Concurrency is a powerful programming technique that can drastically simplify programs when multiple algorithms are required to run independently. All but the simplest of diagnostic programs can benefit from concurrent programming.

For example, consider a logic design in which two input connections are being driven by a diagnostic program. Suppose that the diagnostic wants to drive data on both inputs, but wait for the logic design to accept and process the data before driving more data on each input because the next data depends on what the logic design did. Without concurrent programming, one is forced to create a monolithic loop that has to figure out which connection accepted and processed data at any given time and drive new data on that connection only. This can be a difficult, if not impossible, task.

With concurrent programming, however, one can build two loops, each of which simply drives data and waits for that data to be accepted and processed for a single input connection. Not only is the program now simpler and less prone to error, but the program is structured conceptually the same way as the problem.

Verification system 10 provides the function parallel to configure more than one function, or thread, to execute simultaneously relative to simulation time. In one embodiment, the concurrency mechanism is custom written to handle the unique situations of a simulation environment. Verification system 10 threads do not truly execute in parallel on multiprocessor hardware, but rather cooperatively time share a single processor. This approach was chosen over standard concurrency mechanisms to ensure simulation reproducibility without resorting to complex processor synchronization that would essentially serialize the processors. Context switching is cooperative and occurs only during specific function calls, so global variable manipulation or system function calling is safe and does not require complicated locks or nutexes to ensure exclusivity. The result is an extremely lightweight and robust concurrency capability that does the required job, but no more.

The previous example demonstrated two completely independent algorithms. Quite often in real world cases, however, the algorithms are not quite so independent. Sometimes, algorithms need to synchronize to share resources or to ensure all have reached a certain point before continuing. Suppose in the example, that the diagnostic wanted to send a hundred pieces of data of one type on both input connections and then send a hundred pieces of data of another type on both input connections but not before all the data of the first type was driven on both connections. With the concurrent algorithms, the two loops would need to both reach the same point, or synchronize, before driving a new data type.

In one embodiment, verification system 10 provides several synchronization mechanisms, each specifically tuned for a particular task. Verification system 10 provides a merge function to rejoin concurrent threads into a single thread once they all complete. Verification system 10 also provides a synchronize function and a barrier variable type to synchronize threads at particular points in programs. And, verification system 10 provides obtain and release functions and a semaphore variable type to share global resources between threads.

Verification system 10 assigns an unique number, or identifier, to each and every thread for identification purposes. These identifiers are simple unsigned integers that will always be non-zero and will always be less than the maximum number of allowed threads, which is currently $2^{20}$. The thread identifier value of zero is special and is used to indicate no thread. The maximum number of allowed simultaneous events is an artificial limit imposed to try to prevent runaway thread creation in loops from consuming all of virtual memory; it can be increased in future revisions if the limit is found to be too restrictive. The number of threads used throughout the lifetime of a diagnostic is not limited, however, since the internal data structures that maintain the threads dynamically grow and shrink as required.

A thread's identifier can be recycled and reused for a new thread once the thread dies and all the events created by the thread complete. Diagnostics should be aware of this possibility, since some danger exists in using saved identifiers for new threads that just happen to have the same identifier. The current identifier assignment algorithm, however, only assigns identifiers in increasing order and only revisits lower identifiers once the thread identifier limit has been reached.

The parallel function creates, but does not start, a new thread that will run concurrently with the calling thread. Execution of the new thread does not begin until the thread is chosen through the normal context switching mechanism. The parallel function is non-blocking and returns immediately, allowing multiple threads to be created within no simulation time. No implicit context switch occurs within parallel. The parallel function prototype is:

unsigned parallel(void (* thread)(void *), void * data,
    unsigned stack_size=0);

The parallel function returns the newly created thread's identifier.

A pointer to the function that defines the thread is supplied in the parallel argument thread. Threads must be global functions, not class member functions, that take one void pointer argument and return no value. Functions not conforming to this prototype will cause compiler errors.

The new thread's argument is given the value supplied in the parallel argument data when the new thread eventually starts executing. This argument must be supplied, but it can be ignored by the thread function. The thread argument is of type void to allow any structure pointer to be passed, so it has to be cast into the correct type when used within the thread. The thread argument is intended to differentiate between multiple copies of the same function running as different threads by supplying thread specific global data. If an argument of another type is required, type casts can be made as long as the other type fits within the same storage space used by a void pointer. To pass larger data structures, the data has to be stored elsewhere, preferably a global variable or heap space, and a pointer to that data can be passed to the thread via the argument. Pointers to objects on the creating function's stack (the function that calls parallel) should never be passed as the thread argument since termination of the creating function will automatically destroy the object.

Thread functions should only be terminated by calling the pass, fail or leave functions discussed above, or by simply falling through the end of or returning from the function. The function main is unique and must always be terminated by calling the pass, fail or leave functions and never by falling through the end of or returning from the function. Terminating a thread, including main, with any of the standard C library functions like exit or abort, or falling through the end of or returning from function main will produce undefined results.

In order to be an independent thread, the new thread is given its own stack. The size of a thread's stack in kilobytes can be specified with the optional parallel argument stack size. If the stack size argument is zero (which is the default value if the argument is omitted) the thread will be given a 64 kilobyte stack. In one embodiment, verification system 10 makes no checks to ensure that the stack size is sufficiently large for any thread, so proper stack size management is left entirely to the programmer.

The default stack size should, however, be sufficient for all but the most exotic diagnostic codes (e.g., those that include lots of recursion or those that create large arrays as local automatic variables). Failure to specify adequate stack space will most likely result in a non-descriptive segment violation error.

The parallel function can throw any of the following exceptions to indicate that an error has occurred:
1) not_initialized: This exception indicates that verification system 10 has not been initialized. System 10 requires that diagnostic be called before any other system 10 functions to initialize data structures and initiate communication with the simulator.
2) threads_exhausted: This exception indicates that all the thread identification numbers are utilized and none remain for creating another thread. (This implies an extremely large number of threads, a situation that is not likely to be what the diagnostic intended.

The following example code demonstrates how to declare concurrent functions with parallel:

```
void concurrent_function(void * p) {
    log << *((bundle *) p) << endl;
}
bundle * a, * b, * c;
int main( ) {
    parallel(concurrent_function, a);
    parallel(concurrent_function, b);
    parallel(concurrent_function, c);
}
```

This example spawns three parallel threads and each, each of which displays the thread argument, in this case a bundle. Note that since no implicit context switching functions are called within the thread function, the thread function will run to completion before a context switch will cause another thread to execute.

As noted above, in one embodiment, each thread is given an unique identifier by system 10 when it is created. In one such embodiment, this identifier is returned to the creator of a thread, but is not given to the newly created thread. Threads that need their own thread identifier can obtain it with the thread function. The thread function is nonblocking; it returns immediately. No implicit context switch occurs within the function. The thread function prototype is:

unsigned thread( );

In one embodiment, the thread function throws the not_initialized exception to indicate that system 10 has not been initialized.

The following example code demonstrates how threads can get their own identification number with thread:

```
void concurrent_function(void * p) {
    unsigned id = thread( );
    log << id << endl;
}
int main( ) {
    parallel(concurrent_function, 0);
    parallel(concurrent_function, 0);
    parallel(concurrent_function; 0);
}
```

This example spawns three threads and each prints its own identification number. Notice that in this example the thread argument is ignored, so all are assigned a null value when the threads are created.

In one embodiment, threads are constructed with a hierarchy where a thread that creates a new thread is considered the parent of that new thread and the new thread is considered a child of the thread that created it. This parent and child relationship is analogous to the parent and child relationship of UNIX processes. Threads run independently, but parent threads can be rejoined with all their immediate child threads with the merge function. Rejoining is a very basic form of thread synchronization. If the parent thread has living child threads, the parent thread is blocked from executing until all its child threads have completed. These child threads can also be parents themselves and can also use merge to rejoin with their child threads. Doing so recursively to the youngest child causes the eldest parent thread to wait for all its descendants to complete. Implicit context switching always occurs within merge. The merge prototype is:

void merge(unsigned big limit=0);

The length of simulation time merge will wait for children to complete can be specified with the optional merge argument limit. If the limit value is zero, the default value if no argument is given, then no limit period is set and it is effectively infinite. The units of time are the same units of time used in the logic design wrapper.

The merge function can throw any of the following exceptions to indicate that an error has occurred:

not_initialized: This exception indicates that system 10 has not been initialized.

timeout_expired: This exception indicates that the operation has exceeded the specified amount of simulation time.

timeout_too_large: This exception indicates that the given time-out results in an expiration time beyond the limits of a time variable.

The following example code demonstrates how to join child threads with merge:

```
void merge_and_handle_timeouts( ) {
  try {
    merge(1000); // expect within 1000
  }
  catch (timeout_expired & err) {
    go_handle_merge_timeout( );
  }
}
```

The example sets a timeout period of 1000 time units. If the merge completes successfully, then the function simply returns. However, if the merge times out, then another function is called to handle the timeout condition.

Synchronizing with Barriers

Barriers are a form of thread synchronization that requires that a predefined number of threads reach a certain point before any of them can continue on past that point. Threads that wish to synchronize do so with the synchronize function and a shared barrier variable. If not enough threads have called synchronize, the thread is blocked from executing until enough threads have called synchronize. Once synchronization occurs, the barrier variable is automatically and immediately available for reuse. Implicit context switching always occurs within synchronize. The synchronize function prototype is:

void synchronize(barrier & lock, unsigned big limit=0);

The barrier variable maintaining the state of the synchronization is supplied via the synchronize argument lock. A barrier variable can only be created and destroyed and can not be used in expressions. Upon creation, a barrier variable must be given the size of the barrier tree, or the number of threads that the barrier variable will synchronize. For example:

barrier a(4); if sync 4 threads
barrier * b=new barrier(7); // sync 7 threads

If the size given is zero, the size will be set to one. Note, however, that a barrier for only one thread is pretty useless, but is allowed for completeness.

In one embodiment, once a barrier variable is created, the size can not be modified. Since the barrier variable has to be accessible to all threads, it will need to be a global variable or to be dynamically created on the heap.

In one embodiment, the length of simulation time synchronize will wait for the barrier operation to complete can be specified with the optional synchronize argument limit. If the timeout value is zero, the default value if the argument is omitted, then no timeout period is set and the default is infinity. The units of time are the same units of time used in the logic design wrapper.

The barrier function can throw any of the following exceptions to indicate that an error has occurred:

not_initialized: This exception indicates that Verification system 10 has not been initialized. Verification system 10 requires that diagnostic be called before any other Verification system 10 functions to initialize data structures and initiate communication with the simulator.

not_initialized: This exception indicates that system 10 has not been initialized.

timeout_expired: This exception indicates that the operation has exceeded the specified amount of simulation time.

timeout_too_large: This exception indicates that the given time-out results in an expiration time beyond the limits of a time variable.

The following example code demonstrates how to synchronize three threads with a barrier variable and the synchronize function:

```
barrier my_barrier(3);
void my_thread(void * p) {
  log << "thread" << thread( ) << "before sync" << endl;
  synchronize(my_barrier);
  log << "thread" << thread( ) << "after sync" << endl;
}
int main( ) {
  parallel(my_thread, 0);
  parallel(my_thread, 0);
  parallel(my_thread, 0);
}
```

Three new threads are created, each of which prints two messages: one before synchronization and one after. As a result, the outputs from all threads before the synchronization should be seen before the outputs from after the synchronization.

Sharing Resources with Semaphores

Shared resources in a verification system 10 simulation environment include any global variables and data structures, including logic design features, that all threads can access. Any item for which the number of threads accessing it at any given simulation time needs to be limited can be controlled with a semaphore. A thread that wishes to access a shared object first attempts to obtain access with the obtain function and the semaphore variable associated with the shared object. If no resources are immediately available, the thread is blocked from executing until a resource is freed by another thread. In either case, after returning from obtain, the thread has permission to access the shared object. Implicit context switching always occurs within obtain.

Once finished with the shared resource, a thread releases its access permission with the release function. The release function is non-blocking and returns immediately. No implicit context switching occurs within release. The obtain and release function prototypes are:

void obtain(semaphore & lock, unsigned big limit=0);

void release(semaphore & lock);

The semaphore variable maintaining the state of the shared resource is supplied via the obtain and release argument lock. In one embodiment, a semaphore variable can only be created and destroyed and can not be used in expressions. Upon creation, a semaphore variable must be given the size of the semaphore, or the number of threads that can gain simultaneous access to the shared resource. For example:

semaphore a(4); // allow 4 threads semaphore * b=new semaphore(7); // allow 7 threads If the size given is zero, the size will actually be set to one since a zero size semaphore is senseless. Once a semaphore variable is created, the size can not be modified. Since the semaphore variable has to be accessible to all threads, it will need to be a global variable or dynamically allocated on the heap. The length of simulation time obtain will wait for a resource to become available can be specified with the optional obtain argument limit. If the timeout value is zero, which is the default value if the argument is omitted, then no timeout period is set; the period defaults to infinity. The units of time are the same units of time used in the logic design wrapper.

In one embodiment, the obtain function throws the following exceptions to indicate that an error has occurred:

not_initialized: This exception indicates that system 10 has not been initialized.

timeout_expired: This exception indicates that the operation has exceeded the specified amount of simulation time.

timeout_too_large: This exception indicates that the given time-out results in an expiration time beyond the limits of a time variable.

Similarly, the release function throws the following exception to indicate that an error has occurred:

not_initialized: This exception indicates that system 10 has not been initialized.

In one embodiment cooperative context switching is used in system 10. In such an embodiment, references to global variables are guaranteed to be atomic as long as no verification system 10 calls that implicitly cause a context switch intervene between the references. It is perfectly safe to omit semaphore control for shared resources in this situation, which actually occurs quite often. Typical operations like incrementing global counters or writing status variables fall under operations of this nature. However, to maintain resource control over system 10 calls or over simulation time (which implies a system 10 call), semaphores must be used to control the resource. Most logic design features typically fall into this category.

The following example code demonstrates how to share a resource between three threads with a semaphore variable and the obtain and release functions:

```
semaphore my_semaphore(1);    // only allow 1 thread at a time
int shared_variable;          // the shared resource
void my_thread(void * p) {
    obtain(my_semaphore);         // get permission
    shared_variable++;            // used shared resource
    release(my_semaphore);        // give up permission
}
int main( ) {
    parallel(my_thread, 0);
    parallel(my_thread, 0);
    parallel(my_thread, 0);
}
```

Three new threads are created, each of which wants to increment the shared variable. Exclusivity is guaranteed by surrounding the increment with obtain and release. Of course this example is trivial and does not really need the semaphore control due to cooperative context switching, but it nevertheless serves as an example of how to use semaphores.

Ports

Ports are locations in the simulation where verification system 10 interfaces with the simulation. In one embodiment, verification system 10 contains two major types of ports. The first type is a port at which events are driven or events are captured. These event ports look like ordinary Verilog modules and are connected to the simulation in the logic design wrapper. The second type of port is a memory back door port. In one embodiment, the memory ports are PLI task calls which are utilized to construct a memory model.

In one embodiment, each port is identified with a single, unique, unsigned integer which is specified in the logic design wrapper. Each memory has a single port identifier no matter how many actual read and write ports it contains. Verification system 10 imposes no limit on the quantity of ports or on the port identifiers as long as they fit within an unsigned integer. Keep in mind that to keep diagnostics portable across multiple machines, the port identifiers should be limited to use no more than 32 bits. Port identifiers and memory identifiers share the same number space, so port identifiers of either type must be unique across all event port identifiers and memory port identifiers.

A convenient method for assigning and using port numbers in the diagnostic programming interface is to break up the port number into several fields, each identifying a particular hierarchy in the simulation. However, the exact division of bits is entirely optional and left to the diagnostic programming interface where system differences are taken into account. For example, the port number could be broken up to use 16 bits for a node number, 8 bits for a verification system module number, 4 bits for a chip number and 4 bits for a channel number. In one embodiment, a diagnostic programming interface provides a set of functions that accepts each of these different numbers and packs them together. In another embodiment, the diagnostic programming interface provides event handlers that break apart the port number and display the broken apart fields.

Port identifiers can be difficult for humans to remember, so ports can be assigned names. In one embodiment, diagnostic programming interface assigns names with the setportname function. The setportname function is non-blocking and returns immediately. No implicit context switch occurs within setportname. The setportname function prototype is:

void setportname(unsigned port, const char * name);

The port to be named is supplied in the setportname argument port. The name is supplied in the setportarne argument name. In one embodiment, if the name pointer is null, then the port will have no name. If a name existed on a port when a new name is assigned, the old name is overwritten. In one such embodiment, the name string can contain characters like spaces and unprintable characters. The contents of the name are always copied to internal system 10 structures if they need to be saved, so the names do not have to persist in the diagnostic following the verification system 10 functions to which the names are passed.

Event handlers in the diagnostic programming interface need to obtain port names when they display events, so system 10 also provides the getportname function to retrieve a port name. The getportname function is non-blocking and returns immediately. No implicit context switch occurs within getportname. The getportname function prototype is:

const char * getportname(unsigned port);

with the port whose name is to be retrieved supplied in the getportname argument port. The return value of getportname is the port name. This pointer will be null if the port has no name associated with it.

In one embodiment, port names are also used to identify event functions or memory functions.

Verification system 10 allows diagnostic programming interfaces to attach event handlers to ports that perform some function other that the default event handler. The default event handlers basically display the event in either wiggle or bundle. These event handlers can be changed to allow diagnostic programming interfaces that have defined new event types to display events in their own format or perform any other actions required by events. The configure function attaches match, expect, possible, unknown, pending, expire, orphan and deliver event handlers to a port. When configured, verification system 10 calls these handlers instead of its own built in handlers to display events. The configure function is non-blocking and returns immediately. No implicit context switch occurs within configure. The configure function prototypes are:

```
void configure(unsigned port,
    void (* match)(unsigned, const wiggle &, const char *, unsigned,
        void (*)( ),
    void (* expect)(unsigned, const wiggle &, const char *, unsigned),
    void (* possible)(unsigned, const wiggle &, const char *, unsigned),
    void (* unknown)(unsigned, const wiggle &),
    void (* pending)(unsigned, const wiggle &, const char *, unsigned),
    void (* expire)(unsigned, const wiggle &, const char *, unsigned),
    void (* orphan)(unsigned, const wiggle &, const char *, unsigned));
void configure(unsigned port,
    void (* deliver)(unsigned, const wiggle &),
    void (* expire)(unsigned, const wiggle &, const char *, unsigned),
    void (* orphan)(unsigned, const wiggle &, const char *, unsigned));
void configure(unsigned port,
    void (* match)(unsigned, const bundle &, const char *, unsigned,
        void (*)( )),
    void (* expect)(unsigned, const bundle &, const char *, unsigned),
    void (* possible)(unsigned, const bundle &, const char *, unsigned),
    void (* unknown)(unsigned, const bundle &),
    void (* pending)(unsigned, const bundle &, const char *, unsigned),
    void (* expire)(unsigned, const bundle &, const char *, unsigned),
    void (* orphan)(unsigned, const bundle &, const char *, unsigned));
void configure(unsigned port,
    void (* deliver)(unsigned, const bundle &),
    void (* expire)(unsigned, const bundle &, const char *, unsigned),
    void (* orphan)(unsigned, const bundle &, const char *, unsigned));
```

The port identifier to be configured is supplied in the configure argument port. The configure argument match is a pointer to a handler function that verification system 10 calls for each actual event on the port that matches an expected event. In one embodiment, the match handler must match one of the following two prototypes, dependent on the event type:

```
int (* match)(unsigned port, const wiggle & event,
        const char * name, unsigned id, void (* user)( ));
int (* match)(unsigned port, const bundle & event,
        const char * name, unsigned id, void (* user)( ));
```

In one embodiment, verification system 10 supplies the port identifier in the match argument port, the event object in the argument event, the event name in the argument name, the event identifier in the argument id and the trap handler in the argument user. In order to preserve the trap function behavior, in one embodiment the match handler calls the user supplied handler if the user supplied handler pointer is not null instead of executing its own functionality. In such an embodiment, the match handler is sensitive to the debug flag DEBUG_MATCHES, which can be obtained with the debug function discussed above, and will only display output when this flag is enabled.

The configure argument expect is a pointer to a handler function that verification system 10 calls following the match handler for each expected event on the port that matches an actual event. In one embodiment, the expect handler matches one of the following two prototypes, dependent on the event type:

```
int (* expect)(unsigned port, const wiggle & event,
        const char * name, unsigned id);
int (* expect)(unsigned port, const bundle & event,
        const char * name, unsigned id);
```

In one such embodiment, verification system 10 supplies the port identifier in the expect argument port, the event object in the argument event, the event in the argument name and the event identifier in the argument id. In one embodiment, the expect handler is sensitive to the debug flag DEBUG_MATCHES, which can be obtained with the debug function discussed above, and will only display output when this flag is enabled.

The configure argument possible is a pointer to a handler function that verification system 10 calls following the expect handler for each possible event on the port that is discarded due to the event completion. In one embodiment, the possible handler matches one of the following two prototypes, dependent on the event type:

```
int (* possible)(unsigned port, const wiggle & event,
        const char * name, unsigned id);
int (* possible)(unsigned port, const bundle & event,
        const char * name, unsigned id);
```

Verification system 10 supplies the port identifier in the possible argument port, the event object in the argument event, the event in the argument name and the event identifier in the argument id. In one embodiment, the expect handler is sensitive to the debug flag DEBUG_MATCHES, which can be obtained with the debug function discussed above, and will only display output when this flag is enabled.

The configure argument unknown is a pointer to a handler function that verification system 10 calls for each actual event on the port that does not match an expected event. In one embodiment, the unknown handler matches one of the following two prototypes, dependent on the event type:

int (* unknown)(unsigned port, const wiggle & event);
    int (* unknown)(unsigned port, const bundle & event);

Verification system 10 supplies the port identifier in the unknown argument port and the event object in the argument event. In one embodiment, the unknown handler is not be sensitive to any debug flags and will always display output.

The configure argument pending is a pointer to a handler function that verification system 10 calls following the unknown handler for each expected event on the port still unmatched. In one embodiment, the pending handler matches one of the following two prototypes, dependent on the event type:

```
int (* pending)(unsigned port, const wiggle & event,
        const char * name, unsigned id);
int (* pending)(unsigned port, const bundle & event,
        const char * name, unsigned id);
```

Verification system 10 supplies the port identifier in the pending argument port, the event object in the argument event, the event name in the argument name and the event identifier in the argument id. In one embodiment, the pending handler is not be sensitive to any debug flags and will always display output.

The configure argument expire is a pointer to a handler function that verification system 10 calls for each expected event on the port that remains unmatched beyond its expiration time. In one embodiment, the expire handler matches one of the following two prototypes, dependent on the event type:

```
int (* expire)(unsigned port, const wiggle & event,
        const char * name, unsigned id);
int (* expire)(unsigned port, const bundle & event,
        const char * name, unsigned id);
```

Verification system 10 supplies the port identifier in the expire argument port, the event object in the argument event, the event name in the argument name and the event identifier in the argument id. In one embodiment, the expire handler is not be sensitive to any debug flags and will always display output.

The configure argument orphan is a pointer to a handler function that verification system 10 calls for each expected event on the port that remains after the diagnostic has finished. In one embodiment, the orphan handler matches one of the following two prototypes, dependent on the event type:

```
int (* orphan)(unsigned port, const wiggle & event,
        const char * name, unsigned id);
int (* orphan)(unsigned port, const bundle & event,
        const char * name, unsigned id);
```

Verification system 10 supplies the port identifier in the orphan argument port, the event object in the argument event, the event name in the argument name and the event identifier in the argument id. In one embodiment, the orphan handler is not be sensitive to any debug flags and will always display output.

The configure argument deliver is a pointer to a handler function that verification system 10 calls for each applied event that is completely delivered. In one embodiment, the deliver handler matches one of the following two prototypes, dependent on the event type:

int (* deliver)(unsigned port, const wiggle & event);
    int (* deliver)(unsigned port, const bundle & event);

Verification system 10 supplies the port identifier in the deliver argument port and the event object (see section 7.1) in the argument event. In one embodiment, the deliver handler is sensitive to the debug flag DEBUG_MATCHES, which can be obtained with the debug function discussed above, and will only display output when this flag is enabled.

In one embodiment, verification system 10 calls its own built in handlers for those actions for which the configured event handler is null. Therefore, in such an embodiment not all the event handlers need to be supplied, but they should be for completeness. Event handlers can be disabled by reconfiguring with null pointers or changed by reconfiguring with new pointers at any time by recalling configure.

The configure function can throw any of the following exceptions to indicate that an error has occurred:

not$_{13}$ initialized: This exception indicates that Verification system 10 has not been initialized. Verification system 10 requires that diagnostic be called before any other Verification system 10 functions to initialize data structures and initiate communication with the simulator.

unknown_port: This exception indicates that the given port is not defined as a port by the logic design wrapper.

port_mismatch: This exception indicates that the event type associated with the given port does not match the supplied event type.

In one embodiment, error messages corresponding to the exception being thrown are always displayed and can not be disabled. Exceptions that are not caught in diagnostic code are caught by verification system 10, so exceptions should rarely need to be handled by diagnostics.

Events

The goal of design verification is to ensure that a logic design generates the correct reactions to all valid stimulus. The most interesting part of any simulation environment therefore tends to be the ability to drive stimulus into the inputs and verify the generated reactions emerging from the outputs, collectively referred to as events.

In one embodiment, verification system 10 uses and allows the definition of abstract events to deal with complex structures passed into or out of a logic design, like communication messages. Verification system 10 also provides a small, but very powerful, set of functions to deliver events, automatically verify events and arrange for things to happen in response to events.

In one embodiment, events in verification system 10 are intended to be abstractions of events in Verilog. Events based on other simulation environments could also be used. Verilog events are simply signal state changes but, in one embodiment, verification system 10 events include other parameters (e.g., time stamps, delay times and virtual channels) to create more complex objects ranging all the way from signal state changes up to communication messages like those found in multiprocessor systems. These more abstract events allow diagnostics to be written in more abstract terms which tends to simplify the diagnostics and insulates the diagnostics from low level details. Instead, the low level details are buried in the diagnostic programming interface and in the logic design wrapper where they can be easily maintained in one location.

In one embodiment, verification system 10 defines a base set of event functionality that is generic in nature. In one such embodiment, this base set can be extended by diagnostic programming interfaces using C++ abstraction mechanisms, like inheritance and function overloading, to adapt the event structures and event functionality into more design specific structures and functionality.

The data structures that hold events are called event objects. In one embodiment, as was discussed above, verification system 10 operates directly on two event objects, wiggles and bundles. Diagnostic programming interfaces can overload event functions to accept other design-specific event objects and convert those new types to either wiggles or bundles. Likewise, diagnostic programming interfaces can provide event handlers to convert wiggles or bundles back into design specific event objects for display. In one embodiment, verification system 10 always copies the contents of the event object to internal structures if they need to be saved, so the objects do not have to persist in the diagnostic following the functions to which the names are passed.

As noted above, a wiggle is a very small structure intended to describe a single signal change including the new signal value, a bit mask to indicate the significant bit, a delay time to indicate the time since the previous state change, and the simulation time of the signal change.

The following example code demonstrates some of the a wiggle can be used in diagnostic code:

```
wiggle w;                       // declare wiggles
wiggle w2 = 0xff;
w = 4;                          // set signal value
w.mask = 15;                    // set mask
w.delay = 4;                    // set delay
log << w.time << endl;          // show time
wiggle * p = new wiggle;        // declare wiggles
wiggle * p2 = new wiggle(0xff);
*p = 4;                         // set signal value
p->mask = 15;                   // set mask
p->delay                        // set delay
log << p->time << endl;         // show time
```

The fields of a wiggle are accessed just like any normal field in a C++ class, which is the same as for a C structure. A wiggle can be used in any way that a C++ class or C structure can be used.

As noted above, a bundle is a larger structure intended to describe a message, a sequence of one or more signal changes, including all the signal transitions and a virtual channel.

In one embodiment, a bundle class is a parent class of a wiggle group and inherits all its functionality. In one embodiment, a wiggle group is nothing more than an array of wiggles in which the elements are automatically and dynamically allocated as they are referenced. The bundle length is assumed to be long enough to hold all the elements between element zero and the largest numbered element referenced inclusive.

The length can be explicitly set or obtained using the member function length. The prototypes for the length function are:

unsigned bundle::length( ) const;
void bundle::length(unsigned size);

The vc field indicates the message virtual channel. A bundle's virtual channel must always be less than the number of virtual channels configured for the port in the logic design wrapper. The only operators defined for bundles are the assignment ('='), equal-to ('='), not-equal-to ('!=') and stream-inserter ('<<') operators, so their use is expressions is limited. The following example code demonstrates some of the ways to use a bundle in diagnostic code:

bundle b; // declare bundle
b[0]=4; // set 1st signal, length=1
b[1]=5; // set 2nd signal, length=2
b[0].mask=15; // set 1st mask
b[1].delay=4; // set 2nd delay
b.vc=2; // set virtual channel
unsigned size=b.length( );
b.length(1); // truncate, length=1
b.length(7); // expand, length=7;
bundle * p=new bundle; // declare bundle
(*p)[0]=4; // set 1st signal, length=1
(*p)[1]=5; // set 2nd signal, length=2
(*p)[0].mask=15; // set 1st mask
(*p)[1].delay=4; // set 2nd delay
p->vc=2; // set virtual channel
unsigned size b->length( );
p->length(1); // truncate, length=1
p->length(7); // expand, length=7;

In one embodiment, the fields of a bundle are accessed just like any normal field in a C++ class, which is the same as for a C structure. A bundle can be used in any way that a C++class or C structure can be used. Notice in the examples that bundle pointers are awkward since it is tricky to reference its elements. In one embodiment, system 10 supports a bundle pointer which uses a C++ bundle reference that looks like:

bundle * p=new bundle; // declare bundle
bundle & b=*p; // bundle reference made
b[0]=4; // set 1st signal, length=1
b[1].delay=4; // set 2nd delay
b.vc=2; // set virtual channel In one embodiment, verification system 10 assigns an unique number, or identifier, to each and every event for identification purposes. These identifiers are simple unsigned integers that will always be non-zero and will always be less than the maximum number of allowed events, $2^{24}$ or 16777216. The event identifier value of zero is special and is used to indicate no event. The maximum number of allowed simultaneous events is an artificial limit imposed to try to prevent runaway event creation in loops from consuming all of virtual memory, and can be increased in future revisions if the limit is found to be too restrictive. The number of events used throughout the lifetime of a diagnostic is not limited however, since the internal data structures that maintain the events dynamically grow and shrink as required.

A event's identifier can be recycled and reused for a new event once the event completes. Diagnostics should be aware of this possibility, since some danger exists in using saved identifiers for new events that just happen to have the same identifier. However, the current identifier assignment algorithm only assigns identifiers in increasing order and only revisits lower identifiers once the event identifier limit has been reached, so problems can only occur for identifiers that are saved for an extremely long time. Named events do not suffer from this problem and can be used whenever there is doubt.

In one embodiment, diagnostics can assign a name to events for identification purposes. Events names are assigned to events as optional arguments with the same verification system 10 functions that create events. Event names can then be used instead of event identifiers to identify events in other verification system 10 functions, to identify a group of possible events as a whole, or to make simulation output more readable. Since event names are human readable strings, they provide a convenient mechanism for quickly identifying events in simulation output and can make diagnostic code more readable. In one embodiment, the name string may contain any characters including spaces and unprintable characters, although only printable characters are recommended. The contents of the name are always copied to internal verification system 10 structures if they need to be saved, so the names do not have to persist in the diagnostic following the Verification system 10 functions to which the names are passed.

Diagnostics drive logic design input ports with the apply function. The apply function queues an entire event for later delivery to the logic design and returns immediately without blocking. Verification system 10 takes care of the actual delivery of the event to the ports without diagnostic assistance as the simulation clock advances. No implicit context switch occurs within apply. In one embodiment, the apply function prototypes are:

unsigned apply(unsigned port, const wiggle & event, const char * name=0);
    unsigned apply(unsigned port, const bundle & event, const char * name=0);

The port identifier at which the event is to be delivered is supplied in the argument port. The data object containing the event to be delivered is supplied in the argument event. Diagnostic programming interfaces should overload apply to accept any design specific data structures. In the embodiment shown, events are named with the optional argument name. Names of apply events must be unique and can not be simultaneously shared with any other events, but can be reused after associated events have completed. The apply function returns an unique event identifier for the new event.

In one embodiment, the apply function can throw any of the following exceptions to indicate that an error has occurred:

not_initialized: This exception indicates that verification system 10 has not been initialized.
unknown_port: This exception indicates that the given port is not defined as a port by the logic design wrapper.
port_mismatch: This exception indicates that the event type associated with the given port does not match the supplied event type.
invalid_vc: This exception indicates that the virtual channel in the supplied bundle is larger than the limit imposed for the port by the logic design wrapper.
timeout_too_large: This exception indicates that the timeout in force plus the current time results in an expiration time beyond the limits of an unsigned big variable.
event_conflict: This exception indicates that the given name is already currently in use by another event.
events_exhausted: This exception indicates that all the event descriptors are utilized and none remain for creating another event. This implies an extremely large number of events that is not likely to be what the diagnostic intended.
bad_ipc_write: This exception indicates that the interprocess communication has broken and verification system 10 is unable to send requests to the simulator. The error message will include the specific cause of this error.

Error messages corresponding to the exception being thrown are always displayed and can not be disabled. Exceptions that are not caught in diagnostic code will be caught by verification system 10, so exceptions should rarely need to be handled by diagnostics. If verification system 10 catches the exception, the diagnostic will be terminated.

In one embodiment, wiggle ports have a single apply queue and bundle ports have one apply queue for each virtual channel as defined in the logic design wrapper. The rules that govern how events are placed into the queue are called the apply queue rules. The apply queue rules implicitly determine the order in which event elements are delivered to a port. For wiggle queues, each applied wiggle is pushed in the tail of the queue. For bundle queues, each elemental wiggle is pushed in the tail of the queue that corresponds to the bundle's virtual channel and the bundle ceases to exist as a whole. At each clock interval on a particular port, the queues for that port are examined. If a particular queue is empty, it will be ignored. If the wiggle at the head of a queue has a non-zero delay, the delay is decremented and that wiggle is not eligible for delivery. However, if the wiggle at the head of a queue has a delay of zero and for bundle connections, if the virtual channel corresponding to that queue is not blocked by the port blocking signals, the wiggle is considered eligible for delivery.

If more than one wiggle is eligible for delivery on a given bundle port, the wiggle first applied will have priority to ensure predictable forward progress. Queues that are blocked or lose in arbitration remain unchanged and the wiggle at the head of the queue is eligible again the next clock period if not blocked.

Any delivered wiggle is popped from its queue. The depth of the queues is not artificially limited and dynamically grows and shrinks as needed. Note that the blocking mechanism and concurrent threading mechanism introduce nondeterminism into the above rules such that the ordering of applied events is not guaranteed to be the same order those events are delivered to the logic design.

In one embodiment, the await function is required to explicitly order the delivery of events. The current expiration limit in effect, as set by the timeout function, is stored with the given event as its expiration period. In one such embodiment, applied events that are not completely delivered beyond their expiration period are detected at the first clock edge on any port following the end of the expiration period. Expired events are reported through the error mechanism, but not removed from the queues.

The following code examples demonstrate how to deliver wiggles and bundles with apply:

```
wiggle w = 7;
apply(0, w, "my_wiggle");
apply(1, w, "my_wiggle");    // ERROR! same name
apply(1, w)                  // same without name is OK
await( );                    // after applies complete . . .
apply(1, w, "my_wiggle");    // same name is OK
bundle b;
b.vc = 2;
b[0] = 0;
b[1] = 1;
unsigned x = apply(4, b);    // apply bundle
await(x);                           // wait by descriptor
await(apply(4, b));          // shortcut to apply and wait
apply(5, b, "my_bundle");    // apply named bundle
await("my_bundle");          // wait by name
```

Diagnostics automatically verify logic design output ports with the verify function. The verify function queues the entire potential event for later comparison with output from the logic design and returns immediately without blocking. Verification system 10 takes care of the actual comparison of the event from the ports without diagnostic assistance as the simulation clock advances. No implicit context switch occurs within verify. In one embodiment, the verify function prototypes are:

unsigned verify(unsigned port, const wiggle & event,
　　　　const char * name=0,
　　　　unsigned partner=0);
　　unsigned verify(unsigned port, const bundle & event,
　　　　const char * name=0,
　　　　unsigned partner=0);

The port identifier at which the event is to be checked is supplied in the argument port. The data object containing the event to be checked is supplied in the argument event. Diagnostic programming interfaces should overload verify to accept any design specific data structures. Events are named with the optional argument name. The verify function returns an unique event identifier for the new event.

Sometimes, diagnostics can not fully predict the output of a logic design. In these situations, in one embodiment, verification system 10 provides a feature called possibilities that allows diagnostics to declare all the possible outcomes. Once one of the possibilities is satisfied, all the remaining possibilities are canceled.

In one such embodiment, possibilities are accomplished simply by giving all the possible events identical event names. The drawback to this approach is that unintentionally naming two events the same will not cause an error. In one embodiment verification system 10 tries to limit this potential problem by only allowing possibilities to be declared only from a single thread. Verification system 10 imposes no limit on the number of possibilities except for the maximum number of total events.

Simple possibilities handle most situations, but sometimes more complicated scenarios arise. Sometimes each of the possibilities need to consist of multiple events. In one embodiment, verification system 10 supports this as well through a feature called partners. Each of the required events of a single possibility are called partners. An event's partner is declared by supplying the partner's identifier in the optional verify argument partner. Only one partner needs to be specified since that supplied partner already knows which other events are also partners. Once partners are configured, when one partner event is satisfied, all remaining possibilities are canceled, but the remaining partners are not canceled. Verification system 10 imposes no limit on the number of partners except for the maximum number of total events.

In one embodiment, the verify function throws any of the following exceptions to indicate that an error has occurred:

not_initialized: This exception indicates that verification system 10 has not been initialized.
unknown_port: This exception indicates that the given port is not defined as a port by the logic design wrapper.
port_mismatch: This exception indicates that the event type associated with the given port does not match the supplied data type.
invalid_vc: This exception indicates that the virtual channel in the supplied bundle is larger than the limit imposed for the port by the logic design wrapper.
timeout_too_large: This exception indicates that the timeout in force plus the current time results in an expiration time beyond the limits of a unsigned big variable.
multithread_possibility: This exception indicates that the diagnostic attempted to construct possibilities from more than one thread, which has been disallowed to simplify diagnostics. Constructing possibilities from multiple threads is fraught with danger without resorting to thread synchronization.
unknown_partner: This exception indicates that the supplied partner event does not exist.
multievent_partner: This exception indicates that the supplied partner event exists but belongs to a different event possibility set. Partners should all belong to the same possibility set.
events_exhausted: This exception indicates that all the event descriptors are utilized and none remain for creating another event. This implies an extremely large number of events that is not likely to be what the diagnostic intended.

Error messages corresponding to the exception being thrown are always displayed and can not be disabled. Exceptions that are not caught in diagnostic code will be caught by verification system 10, so exceptions should rarely need to be handled by diagnostics. If verification system 10 catches the exception, the diagnostic will be terminated.

No order at the logic design output is implied by the order in which verify is called. Ordering of output verification must be accomplished through synchronization with the await function. The current expiration limit in effect, as set by the timeout function, is stored with the given event as its expiration period. Events that are not successfully compared before their expiration period will be detected at the first clock edge on any port following the end of the expiration period.

Expired events are reported through the error mechanism and removed from the queues. The following code examples demonstrate how to verify wiggles and bundles with verify:

```
wiggle w = 7;
verify(0, w, "my_wiggle");
verify(1, w, "my_wiggle");      // possibility
verify(1, w)                    // not a possibility
await();                        // after verifies complete . . .
verify(1, w, "my_wiggle");      // not a possibility
bundle b;
b.vc = 2;
b[0]= 0;
b[1]= 1;
unsigned x = verify(4, b);      // verify bundle
await(x);                       //   wait by descriptor
await(verify(4, b));            // shortcut to verify and wait
verify(5, b, "my_bundle");      // verify named bundle
await("my_bundle");             // wait by name
```

The next code examples demonstrate how to set up possibilities and partners of both wiggles and bundles with verify:

```
wiggle a, b, c;
unsigned p = verify(0, a, "complex");
verify(0, b, "complex", p);                      // (a && b)
verify(0, c, "complex");                         // (a && b) || c
wiggle d, e, f;
verify(0, d, "complex", verify(0, e, "complex"));
verify(0, f, "complex");                         // (d && e) || f
bundle a, b, c;
unsigned p = verify(0, a, "complex");
verify(0, b, "complex", p);                      // (a && b)
verify(0, c, "complex");                         // (a && b) || c
wiggle x, y;
bundle z;
verify(5, x, "mixed");
verify(4, y, "mixed");
verify(3, z, "mixed");
```

Note in the last example that possibilities or partners can happen on different ports and they can also be different event types. The only limitation with mixing event types emerges when one tries to capture the actual event with await, which can not be done. It is still possible, however, to simply wait for and not capture a mixed possibility with await.

The apply and verify functions are both non-blocking and merely queue up events and immediately return. This allows many events to be set up in zero time, but at some point, time needs to progress or diagnostics need to wait for the currently queued events to complete before queuing more to ensure order. The await function blocks the current thread until a selected event or all events complete. Event completion is defined as when an applied event is completely delivered to a simulation or when an expected event is matched against a complete actual event. Implicit context switching always occurs within await. The await prototypes are:

```
unsigned await(const char * name);
unsigned await(const char * name, unsigned & port,
                    wiggle & event);
unsigned await(const char * name, wiggle & event);
unsigned await(const char * name, unsigned & port,
                    bundle & event);
unsigned await(const char * name, bundle & event);
unsigned await(unsigned id);
unsigned await(unsigned id, unsigned & port,
                    wiggle & event);
unsigned await(unsigned id, wiggle & event);
unsigned await(unsigned id, unsigned & port,
                    bundle & event);
unsigned await(unsigned id, bundle & event);
void await( );
```

The event of interest is identified by either an event name in the argument name or an event identifier in the argument id. If no identifier or name is supplied, then await waits for all events created by the same thread that called await to complete and no actual events are captured. The await function stores the port identifier on which the event was captured into the variable supplied in the optional argument port and the await function stores the captured event object into the variable supplied in the optional argument event. The actual event object will contain the actual time values that each component was actually delivered or received from the logic design wrapper. The await function returns the event identifier of the event that completed the wait. The returned event identifier will be zero if the given event is unknown to the kernel at the time await is called or if await was unblocked due to the destruction of an unused possibility or the cancellation of a trap.

When given an event identifier for an event that is a possibility or a partner, await simply waits for that specific event to complete either through successful comparison or through removal as an unused possibility. However, when given an event name that refers to possibilities or partners, await waits for the event name to cease to exist which occurs only after all the possibilities and partners have been completed either through successful comparison or through removal as an unused possibility. The event identifier returned by await is usefull to determine which event in a group of possibilities satisfied await. When partners exists for a possibility, the partner that completes last will be the returned identifier and the actual object saved.

In one embodiment, the await function throws the following exceptions to indicate that an error has occurred:
not_initialized :This exception indicates that verification system 10 has not been initialized.
missing_event: This exception indicates that the supplied event name is null.
wrong_container: This exception indicates that the supplied event container type does not match the type of the captured event. The types must match in order to save the event.

Error messages corresponding to the exception being thrown are always displayed and can not be disabled. Exceptions that are not caught in diagnostic code will be caught by verification system 10, so exceptions should rarely need to be handled by diagnostics.

The following example code demonstrates how to wait for events to complete and capture those events with await:

```
unsigned port;
wiggle act;
wiggle w = 13;
apply(0, w);
unsigned e = verify(1, w);
await(e, port, act);        // wait and capture actual
apply(1, w)
await(verify(2, w));        // shortcut to avoid variable e
apply(7, w, "x1");
apply(8, w, "x2");
await( );                   // wait for x1 and x2 to complete
```

The await function provides an alternate means for thread synchronization besides barriers and the synchronize function. To synchronize multiple threads, the threads that wish to synchronize can simply call await for the same event. Once the event completes, all the threads will then be unblocked and ready to run at the same time.

In one embodiment, diagnostics can bypass the automatic event verification and instead can use the trap function to receive logic design output that matches a given event. The trap function queues the entire potential event for later comparison with output from the logic design and returns immediately without blocking. In one such embodiment, verification system 10 takes care of the actual comparison of the event from the ports without diagnostic assistance as the simulation clock advances and calls a supplied handler function when an event is captured. No implicit context switch occurs within trap. The trap function prototypes are:

```
unsigned trap(unsigned port, const wiggle & event,
                    void (* user)(unsigned, const wiggle &));
unsigned trap(unsigned port, const bundle & event,
                    void (* user)(unsigned, const bundle &));
```

The port identifier at which the event is to be caught is supplied in the argument port. The data object containing the event to be caught is supplied in the argument event. Diagnostic programming interfaces should overload trap to accept any design specific data structures. The event handler, or the user supplied function to call when the event is caught, is supplied in the argument user. The handler function must return no value and take two arguments. The first will contain the port number and the second will contain the actual event. Failure to supply a function matching this prototype will result in a compiler error. The trap function returns an unique event identifier for the new event.

In one embodiment, once a trap is satisfied, the trap is automatically removed. Therefore, if the trap needs to continue to be in place following captured events, the handler has to rearm the trap by calling trap again.

In one embodiment, the trap function throws the following exceptions to indicate that an error has occurred:
not_initialized: This exception indicates that Verification system 10 has not been initialized.
unknown_port: This exception indicates that the given port is not defined as a port by the logic design wrapper.
port_mismatch: This exception indicates that the event type associated with the given port does not match the supplied data type.

invalid_vc: This exception indicates that the virtual channel in the supplied bundle is larger than the limit imposed for the port by the logic design wrapper.

events_exhausted: This exception indicates that all the event descriptors are utilized and none remain for creating another event. This implies an extremely large number of events that is not likely to be what the diagnostic intended.

Error messages corresponding to the exception being thrown are always displayed and can not be disabled. Exceptions that are not caught in diagnostic code will be caught by verification system 10, so exceptions should rarely need to be handled by diagnostics. If verification system 10 catches the exception, the diagnostic will be terminated.

No order at the logic design output is implied by the order in which trap is called. Ordering of output capturing must be accomplished through synchronization with the await function.

Traps are intended to be optional such that they do not have to be satisfied. Diagnostics will not wait for traps to complete before terminating. Therefore, there is little or no need for a timeout period so the timeout periods have no effect on traps and traps will never timeout. Traps can be explicitly removed with the cancel function described next.

The following example code demonstrates how to set up a trap handler function with trap:

```
void handler(unsigned port, const wiggle & actual) {
    log << "At port" << port << "got" << actual << endl;
}
int main( ) {
    wiggle w = 0x4e;
    w.mask = 0xff;
    unsigned e;
    e = trap(0, w, handler);     // trap if 0x4e in low byte
    // rest of diagnostic
}
```

Diagnostics can remove any trap with the cancel function. The cancel function is non-blocking and returns immediately. No implicit context switch occurs within cancel. The cancel function prototype is:

void cancel(unsigned id);

where the trap event is identified by an event identifier in the argument id.

In one embodiment, the trap function throws the following exceptions to indicate that an error has occurred:

not_initialized: This exception indicates that verification system 10 has not been initialized.

missing_cancel: This exception indicates that the supplied event does not exist or does not correspond to a trap.

Error messages corresponding to the exception being thrown are always displayed and can not be disabled. Exceptions that are not caught in diagnostic code will be caught by verification system 10, so exceptions should rarely need to be handled by diagnostics.

The following example code demonstrates how to cancel traps with cancel:

```
void handler(unsigned port, const wiggle & actual);
int main( ) {
    wiggle w = 0x4e;
    w.mask = 0xff;
    unsigned e;
    e = trap(0, w, handler);     // trap if 0x4e in low byte
```

```
    cancel(e);                   // cancel trap
}
```

In one embodiment, diagnostics can specify the maximum amount of time events wait before being delivered or being verified with the timeout function. Timeout periods can be set on a port by port basis or on a global basis. The timeout function is non-blocking and returns immediately. No implicit context switch occurs within timeout. In one embodiment, the timeout function prototypes are:

void timeout(unsigned big limit);

void timeout(unsigned port, unsigned big limit);

If a port timeout is configured, then the port timeout is used for events associated with that port. If a port does not have a timeout configured, then the global timeout is used for event associated with that port. If a port does not have a timeout configured and the global timeout is not configured, then no timeout is used. By default, no timeouts are configured and used.

The timeout argument limit specifies the timeout period. If the timeout period is zero, then the timeout period is canceled and the timeout period is effectively infinity. Without a port, timeout configures the global timeout. With a port supplied in the optional timeout argument port, timeout configures the port timeout.

In one embodiment, the timeout function throws a not_initialized exception to indicate that verification system 10 has not been initialized., an unknown_port exception to indicate that the given port is not defined as a port by the logic design wrapper and a port_mismatch exception to indicate that the event type associated with the given port does not match the supplied data type.

In one such embodiment, error messages corresponding to the exception being thrown are always displayed and can not be disabled. Exceptions that are not caught in diagnostic code will be caught by verification system 10.

The following example code demonstrates how to set timeout periods with timeout:

```
timeout(1000);       // set global limit
timeout(7, 2000);    // set port 7 limit to 2000
```

When events can not be verified or events timeout, the errors are not fatal and do not necessarily terminate the diagnostic. Verification system 10 will allow a definable number of errors to occur before terminating the diagnostic. The number of errors to allow is set with the tenacity function. The tenacity function is non-blocking and returns immediately. No implicit context switch occurs within tenacity. The tenacity function prototype is:

void tenacity(unsigned quantity);

The number of event errors to allow before terminating the diagnostic is supplied in the tenacity argument quantity. If the supplied number is zero, then the number of errors will be set to one.

In one embodiment, the tenacity function throws a not_initialized exception to indicate that verification system 10 has not been initialized. In one such embodiment, error messages corresponding to the exception being thrown are always displayed and can not be disabled. Exceptions that are not caught in diagnostic code will be caught by verification system 10. If verification system 10 catches the exception, the diagnostic will be terminated.

As noted above, quite often, memories within the simulation need to be directly written or read, bypassing the design's normal mechanisms for accessing the memory. This back door into memories can greatly speed simulations that need to obtain snapshots of a memory's contents or preset those memory contents. For example, for a processor verification, it might be handy to preload the instruction buffer to avoid fetches to external memory.

Verification system 10 provides the functions to reference special memories directly. In one embodiment, in order for system 10 to gain access to the memories, the memories have to be models built using the memory access PLI tasks. Memory models must be constructed using PLI tasks due to the limitations of the Verilog PLI interface which prevent access to arrays of registers, or Verilog memories. In one embodiment, these modules are constructed to appear like the memory needed for the logic design, but will internally store data inside of system 10.

This technique does have a downfall, however, when simulations must be run with real vendor supplied memory models to absolutely ensure that the logic design functions. In one embodiment, one avoids this problem by guaranteeing equivalence between the vendor supplied memory model and the verification memory model. This decision is part of a design flow that must decided project to project. It should be noted, however, that using vendor supplied memory models renders diagnostics that use the system 10 memory access functions non-runnable.

As noted previously, diagnostics can write memory contents with the fill function. In one embodiment, the acquisition occurs immediately without regard to time or event ordering. The fill function is blocking and returns once the simulation acknowledges that the memory contents were written; however, the acknowledgment always occurs at the next clock edge at any port, and is almost immediate. Consequently, an implicit context switch occurs within fill.

In one embodiment, if the simulator is a two state simulator, then high impedance bits will be silently converted to zeros and unknown bits will be silently converted to ones and no error will be flagged. The mask fields in the supplied values are taken into consideration and only those bits in the memory that correspond to bits set to one in the mask are changed. This mask ability makes it easy to modify bits contained within larger memories.

The fill function returns the number of memory elements actually written. The number actually written may be smaller than the requested number if the requested size would take the write beyond the end of the memory. In one embodiment, the fill function throws the following exceptions to indicate that an error has occurred:

not_initialized: This exception indicates that system 10 has not been initialized.
unknown_port: This exception indicates that the given port is not defined as a port by the logic design wrapper.
port_mismatch: This exception indicates that the event type associated with the given port does not match the supplied event type.
bad_ipc_write: This exception indicates that the interprocess communication has broken and system 10 is unable to send requests to the simulator. The error message will include the specific cause of this error.

Error messages corresponding to the exception being thrown are always displayed and can not be disabled. Exceptions that are not caught in diagnostic code will be caught by system 10, so exceptions should rarely need to be handled by diagnostics. If system 10 catches the exception, the diagnostic will be terminated.

Diagnostics can read memory contents with the extract function. The acquisition occurs immediately without regard to time or event ordering. The extract function is blocking and returns once the simulation supplies the memory contents; however, the acknowledgment always occurs at the next clock edge at any port, and is almost immediate. Consequently, an implicit context switch occurs within extract.

If the simulator is a two state simulator, then high impedance bits will be silently converted to zeros and unknown bits will be silently converted to ones and no error will be flagged. The mask fields in the supplied values are taken into consideration and only those bits in the memory that correspond to bits set to one in the mask are changed. This mask ability makes it easy to modify bits contained within larger memories. The data buffer must be large enough to hold all the elements being retrieved.

In one embodiment, the extract function returns the number of memory elements actually read. The number actually read may be smaller than the requested number if the requested size would take the read beyond the end of the memory.

The extract function can throw any of the following exceptions to indicate that an error has occurred:

not_initialized: This exception indicates that system 10 has not been initialized.
unknown_port This exception indicates that the given port is not defined as a port by the logic design wrapper.
port_mismatch: This exception indicates that the event type associated with the given port does not match the supplied event type.
bad_ipc_write: This exception indicates that the interprocess communication has broken and system 10 is unable to send requests to the simulator. The error message will include the specific cause of this error.

Error messages corresponding to the exception being thrown are always displayed and can not be disabled. Exceptions that are not caught in diagnostic code will be caught by system 10, so exceptions should rarely need to be bandied by diagnostics. If system 10 catches the exception, the diagnostic will be terminated.

Signal Access

One reason for using system 10 is for system 10's event handling functionality. This functionality provides the ability to write diagnostics at an abstract level and provides sophisticated delivery and verification mechanisms. However, sometimes it may not be realistic to connect all the interesting signals in a simulation to system 10. Sometimes there are just too many interesting signals to expect anyone to connect them all to system 10 ports; some signals may only be useful to a limited number of diagnostics. In addition, in cases where system 10 uses both processor and memory resources for each port, having too many ports might not be wise.

The usefulness of having the signal attached to a system 10 interface port must be weighed against the extra time and memory required to do so.

To alleviate the need to connect every interesting signal to a port, in one embodiment system 10 supplies a set of functions to gain direct access to simulation signals. These functions allow diagnostics to get, set, or wait for certain values on arbitrary signals in the simulator. Be warned, however, that reaching directly into logic designs is a dangerously slippery slope and direct access is better limited to the external boundaries of a logic design. Logic designs frequently change internally to account for architecture changes, bug fixes and timing, among other things. A simple logic design change could lead to the need to change dozens or hundreds of diagnostics if directly accessed signals change. Also keep in mind that many optimizing simulator compilers flatten hierarchy and remove some signals, so arrangements must be made to ensure that the signals of interest remain accessible.

In one embodiment, system 10 direct access functions are not related to simulation time. That is, setting or getting signals occurs almost immediately, so any alignment of these operations in simulation time has to be accomplished through other synchronization means (i.e., by waiting for events with await or waiting for barriers with synchronize). In one embodiment, direct access functions require a small amount of simulation time to complete; they will be satisfied coincident with the first clock at any port following the satisfying change.

The value of registers in the simulation can be set with the deposit function. Likewise, the values of elements in register arrays, or memories, can not be set with the deposit function. In one embodiment, the value change occurs immediately without regard to time or event ordering. In one such embodiment, the deposit function is blocking and returns once the simulation acknowledges that the signal has been written. The acknowledgment, however, always occurs at the next clock edge at any port, and is almost immediate. Consequently, an implicit context switch occurs within deposit.

The deposit function prototype is:

void deposit(const char * term, const reg & value);

where the full hierarchical path of the signal to write is supplied as a string to deposit in the argument term.

A four state value is written into the argument value. If the simulator is a two state simulator, then high impedance bits will be silently converted to zeros and unknown bits will be silently converted to ones and no error will be flagged. The mask field in the supplied value is taken into consideration and only those bits in the signal that correspond to bits set to one in the mask are changed. This mask ability makes it easy to modify bits contained within larger control registers.

In one embodiment, the deposit function throws the following exceptions to indicate that an error has occurred:

not_initialized: This exception indicates that system 10 has not been initialized.

unknown_access :This exception indicates that the given signal does not exist in the simulator or that the given signal is not a register. (The given signal must be the full hierarchical path name of a register.)

bad_ipc_write: This exception indicates that the interprocess communication has broken and system 10 is unable to send the deposit request to the simulator. The error message includes the specific cause of this error.

Error messages corresponding to the exception being thrown are always displayed and can not be disabled. Exceptions that are not caught in diagnostic code will be caught by system 10 , so exceptions should rarely need to be handled by diagnostics.

The following code example demonstrates some of the possible ways to use the deposit function:

```
deposit("top.chip0.input", 3);
char * p = "top.chip0.input";
reg r;
r = 0x18;                  // new value
```

```
r.mask = 0xf8;             // only change bits 3 through 7
deposit(p, r);
```

The value of registers, wires, inputs and outputs in the simulation can be acquired with the sample function. The values of elements in register arrays, or memories, cannot, however, be acquired with the sample function. The acquisition occurs immediately without regard to time or event ordering.

The sample function is blocking and returns once the simulation supplies the signal value; however, the acknowledgment always occurs at the next clock edge at any port, and is almost immediate. Consequently, an implicit context switch occurs within sample. The sample function prototype is:

void sample(const char * term, reg & value);

The full hierarchical path of the signal to write is supplied in the sample argument term.

The container to hold the signal value is supplied in the sample argument value. The mask field in the supplied container is insignificant and is always reset to have all bits set by sample. In the event that sample throws an exception, the contents of the variable supplied as a container is undefined and may or may not be modified.

In one embodiment, the sample function throws the following exceptions to indicate that an error has occurred:

not_initialized: This exception indicates that system 10 has not been initialized.

unknown_access This exception indicates that the given signal does not exist in the simulator or that the given signal is not a register, wire, input or output. (The given signal must be the full hierarchical path name of a register, wire, input or output.)

bad_ipc_write: This exception indicates that the interprocess communication has broken and system 10 is unable to send the deposit request to the simulator. The error message includes the specific cause of this error.

Error messages corresponding to the exception being thrown are always displayed and can not be disabled. Exceptions that are not caught in diagnostic code will be caught by system 10, so exceptions should rarely need to be handled by diagnostics.

The following code example demonstrates some of the possible ways to use the sample function:

```
reg r;
sample("top.chip0.input", r);
char * p="top.chip0.input";
reg r;
sample(p, r);
```

A common operation that always seems to be needed is the ability to wait for a signal to change state. Usually, this operation is accomplished through polling (i.e., repeatedly sampling and delaying within a tight loop). Polling, however, is inefficient and, with the interprocess communication involved in system 10, becomes intolerable. In one embodiment, system 10 does not include a direct method of simply delaying for a certain amount of time. This is done in part to make polling a difficult operation.

Instead, system 10 provides the examine function that can either wait for a signal to simply change value or wait for a signal to change to a specified value. In either case, the examine function gets the new signal value. The examine function is obviously blocking since it waits for a period of simulation time. Consequently, an implicit context switch occurs within examine. The examine function prototypes are:

void examine(const char * name, reg & value, unsigned
   big limit=0);
void examine(const char * name, reg & value, const reg
   & test,
   unsigned big limit=0);

The full hierarchical path of the signal to write is supplied in the examine argument term.

The container to hold the signal value is supplied in the examine argument value. The mask field in the supplied container is insignificant and is always reset to have all bits set by examine. In the event that examine throws an exception, the contents of the variable supplied as a container is undefined and may or may not be modified.

In one embodiment, optional examine argument test is a four state signal value which represents the value system 10 is waiting for. If the simulator is a two state simulator, then high impedance bits will be silently converted to zeros and unknown bits will be silently converted to ones and no error will be flagged. The mask field in the test value is taken into consideration and only those bits in the signal that correspond to bits set to one in the mask are tested. This mask ability makes it easy to test bits contained within larger control registers.

The length of simulation time examine will wait for the desired signal change is supplied in the optional examine argument limit. If the timeout value is zero, which is the default value if no argument is given, then no timeout period is set and the timeout period is effectively infinity. The units of time are the same units of time used in the logic design wrapper.

Note that examine expects something to happen and a diagnostic will not terminate as long as outstanding examine requests remain. In other words, examine requests are not optional. This behavior is fine as long as a diagnostic is expecting something, but not right if a diagnostic is simply examining something to test if something occurs. In order to do the latter, diagnostics have to use the examine timeout mechanism and catch the exception thrown once nothing is found, or better yet, the signal should be attached to a port and the trap function should be used.

In one embodiment, the examine function throws the following exceptions to indicate that an error has occurred:
not_initialized: This exception indicates that system 10 has not been initialized.
unknown_access: This exception indicates that the given signal does not exist in the simulator or that the given signal is not a register, wire, input or output. (The given signal must be the full hierarchical path name of a register, wire, input or output.)
timeout_expired: This exception indicates that the operation has exceeded the specified amount of simulation time.
timeout_too_large: This exception indicates that the given timeout plus the current time results in an expiration time beyond the limits of a unsigned big variable.
bad_ipc_write: This exception indicates that the interprocess communication has broken and system 10 is unable to send the request to the simulator. The error message will include the specific cause of this error.

Error messages corresponding to the exception being thrown are always displayed and can not be disabled. Exceptions that are not caught in diagnostic code will be caught by system 10, so exceptions should rarely need to be handled by diagnostics.

The following code example demonstrates some of the possible ways to use the sample function:

```
reg r;
examine("top.chip0.input", r);           // wait for next to change
char * p = "top.chip0.input";
reg r;
reg t = 0x14;
t.mask = 0x3f8;
examine(p, r, t);                        // wait for bits 2-9 to be 0x14
reg r;
try {
    examine("top.chip0.input", r, 100);  // wait up to 100
}
catch (timeout_expired & error) {
    handle_no_signal_change( );          // do something if timed out
}
```

As noted above, in one embodiment, diagnostics are developed, at least in part in C or C++. One consequence of developing diagnostics in C/C++ is the loss of visibility into lower-levels of the design under test. For instance, it isn't intuitively obvious what logic is being exercised by a high-level operation such as apply(event). To bridge this abstraction gap code coverage analysis tools, like Summit Design's HDLScore, can be used to get a more in-depth look at how the design is being exercised by a diagnostic suite. The use of code coverage analysis tools in hardware design verification is analogous to the use of profiling tools used in software development.

A sample application of verification system 10 will be discussed next. The hardware design used for this example is a network router 50 for an imaginary multiprocessor computer (MP). The MP computer of this example includes several independent nodes. Each node includes a 32 bit processor with memory. The nodes are connected by a network of the network routers that are to be verified. The routers are responsible for routing messages between the nodes, synchronizing multiple processors and interfacing with miscellaneous external signals.

Figure 6:
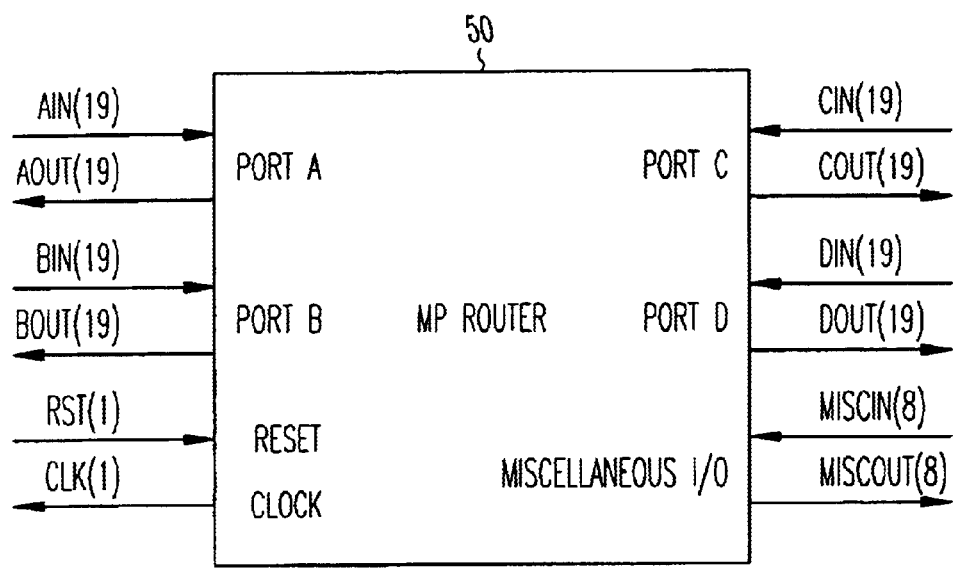
FIG. 6 illustrates example MP router I/O connections.

MP router I/O connections are illustrated in FIG. 6. The router has four time multiplexed external messaging ports, port A through port D, with a fifth, non-multiplexed, internal messaging port, port L, for messages destined to or originating from the router itself. The internal port is used to gain access to local registers within the router. Messages entering on any of the five input ports are routed to any output port via a crossbar and a central look-up table that is physically an array of internal local registers named LUT. Cross bar arbitration contains aging mechanisms to ensure that messages make forward progress in a timely fashion and are not stalled indefinitely. The router also has eight miscellaneous input lines and eight miscellaneous output lines that are connected to internal local registers named MISCIN and MISCOUT respectively. The clock input is the master clock for the router and is nominally 100 Mhz. The router design is completely synchronous. The router core and the miscellaneous inputs and outputs operate at the clock frequency while all the messaging ports run at twice the clock frequency. The reset input does the obvious and resets the router to a predefined condition. And, an internal local register named LOCK facilitates atomic operations for multiprocessor synchronization.

The external communication channels, port A through port D, are time division multiplexed such that two data transfers occur within a single clock. Since the channels are physically 19 bits wide, a total of 38 bits are transferred within a single clock period. Each 38 bit transfer is individually flow controlled and termed a flow control unit, or a flit.

The most significant bits, bit 19 through bit 37, are transmitted while the clock is high and the least significant bits, bit 0 to bit 18, are transmitted while the clock is low. The most significant bits are received and latched on the negative edge of the clock and the least significant bits are received and latched on the positive edge of the clock.

The internal communication channel, port L, is a full 38 bits wide and, therefore, not time division multiplexed. That is, a whole flit is simply transferred one per clock. The channel transmitter and channel receiver are effectively simple pass-through wires.

Each physical communication channel carries three virtual channels. Multiple virtual channels allow messages to pass stalled messages on different virtual channels and allow for deadlock free routing through careful selection of which messages flow on which virtual channel. For the MP multiprocessor, request messages flow on virtual channel 0, response messages flow on virtual channel 1 and control messages flow on virtual channel 2. Virtual channel 2 has the highest priority, virtual channel 1 has the next highest priority and virtual channel 0 has the lowest priority at points of arbitration. Messages that start using a particular virtual channel own that virtual channel until the message is complete. No other message is allowed to break into the middle of another message unless it is flowing on a different virtual channel.

The flow of data across each virtual channel is controlled with a FIFO buffer following the channel receiver and a free space counter before the channel transmitter. The counter is initialized at reset to 8 which equals the number of elements in the buffer. As each it is transmitted, the counter corresponding to the it's virtual channel is decremented and represents the number of available buffer slots. Once the counter reaches zero, the channel is considered fully blocked. As each flit is extracted from the buffer, an acknowledge is sent back to the counter over the channel flowing in the opposite direction. The acknowledge increments the counter, allowing the buffer space to be used once again.

Figure 7:
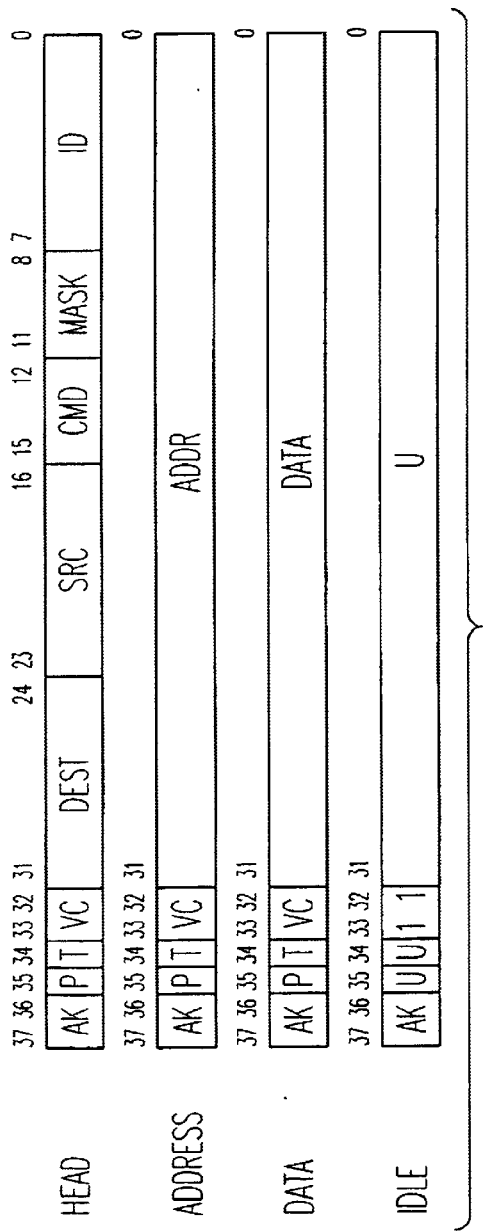
FIG. 7 illustrates four elemental flit encodings.

Messages are constructed from one or more flits and flow completely on a single virtual channel. The four elemental flit encodings are detailed in FIG. 7. A message consists of one and only one head flit, an optional address flit and zero to four data flits. Idle flits are not part of any messages but are transmitted when there is no message it to transmit.

The VC field indicates which of the three virtual channels the flit is traveling on. Note that virtual channel 3 does not exist; its encoding is used to identify an idle flit.

The T field indicates if the flit is a tail flit. The last flit in a message has the tail bit set and all other flits in a message have the tail bit cleared. Note that there is no bead flag as the next flit following a tail flit on any given virtual channel is assumed to be a head flit.

The AK field indicates which of the three virtual channels is being acknowledged for flits owing in the opposite direction on the channel. There is one acknowledge for each flit and each acknowledge indicates to the transmitting logic that a buffer slot on the receiving logic consumed by a flit has been freed. Idle flits are not acknowledged since they are not buffered. An acknowledge value of 3 indicates that there is no acknowledge.

The DEST field in the head flit contains the identity of the destination node or router. This field indirectly determines which output port to which the router sends the message. The destination field is used as an address to the internal look-up table, LUT. The output of the look-up is the output port identifier. The identity of the routers and nodes is only determined by the routing tables that direct messages to a particular router or node, so care must be exercised to construct a proper routing table.

The remaining fields are simply content information that play no part in the messaging routing. Some of these fields, however, are used by the router for messages destined for or created by local register references, as will be detailed below. The SRC field in the head flit contains the identity of the sending node or router. The CMD field in the head flit contains the message command. The MASK field in the head flit contains a bit mask indicating which words of a cache-line are contained within the message (used if the message is a cache-line read or cache-line write message). The MASK field is unused otherwise. The ID field in the head flit contains a message identifier. The ADDR field in the address flit contains the message cache-line address. The DATA field in the data flit contains the message data. The P field in all the flits is an odd parity bit that protects only bits 0 through 31 of the flits. The parity is not checked until the it reaches its final destination.

Figure 8:
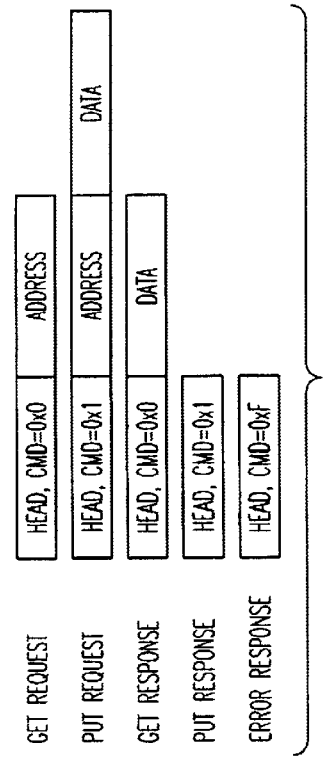
FIG. 8 illustrates valid message formats of messages that are bound for or originate from port L, the internal message port.

When routing between port A through D, the router will route messages of any length containing any contents, despite the MP multiprocessor limitation of four data its per packet. But messages that are bound for or originate from port L, the internal message port, must conform to the message formats shown in FIG. 8.

Of the five message formats shown, only the two request messages can be sent to the router on virtual channel 0 and only the three response messages are generated by the router on virtual channel 1. Under normal conditions, the router generates a put response message for each put request message and a get response message for each get request message. For any received request messages on virtual channel 0 with unknown commands, any received request messages that are the wrong length or any received request messages with invalid register addresses, the router generates an error response message. The head flit in the response message is constructed by copying the request ID field, swapping the request DEST and SRC fields and inserting the response command into the CMD field. Any response message received on virtual channel 1, any control message received on virtual channel 2 or any message received with bad parity in any of the flits are swallowed so no response is generated.

Only message address bits 2 through 15 are decoded and checked when registers are referenced. Note that since in this example all put or get references are fill word (4 byte) references, the registers are aligned on word boundaries.

The routing mechanism of the MP router is very simple. Each message entering the router has a destination, the DEST field, which is used as the address of a central look-up table named LUT. Two pieces of data from the look-up table determine the output port for the message. A single bit L field indicates an internal destination via port L and a two bit PT field selects one of the four external ports. The L bit, if set, forces the message the internal port of the router, port L, no matter the value of PT.

The MP router has eight miscellaneous inputs and eight miscellaneous outputs. The registers MISCIN and MISCOUT provide access to these miscellaneous pins. The miscellaneous inputs are latched on the positive edge of the clock. Reading the MISCIN register reads the input latches. The miscellaneous outputs are latched by the MISCOUT register itself.

The MP router has a register named LOCK to be used to synchronize multiple processors. Synchronization is achieved by ensuring that one and only one process reads a written value. All the other processors read 0. The LOCK register is a normal read or write register except that the DATA field is always cleared after it is read. Since only one message can be actively reading the register at any given time, this ensures that only one request will get the saved data.

The first step in building a verification environment with system 10 is to decide what configuration of a system to construct. Considering the MP router, we could construct an environment surrounding a single router or we could construct an almost infinite number of environments surrounding networks of multiple routers. The selection of a proper environment usually depends on the verification needs of the design project. It is also possible to construct scripts to automatically generate a wrapper conforming to a given configuration. In this example, to keep things simple, the single router environment will be discussed. Note that while this example wrapper is not trivial, it is still small enough to be dwarfed by the design.

The MP router communication channels are a natural fit with system 10's communication channel support. Therefore, all the MP router communication channels will be terminated with communication channel stubs. (Note, however, that the communication channel stubs do not contain any flow control logic. This logic must be included in the wrapper. In this example it is contained within the rtr stub module.)

It is also possible to construct a custom stub that contains the necessary flow control logic. This is a much more complicated undertaking, but may sometimes be necessary for channels that can not conform with the generic communication channel stub.

The remaining signals, reset, miscin and miscout, are terminated with simple value change stubs for direct diagnostic control. Note that the communication channel stubs also have an input to stall the channels that are also connected via value change stubs. The result is shown in FIG. 9.

The MP router communication channel stub simply instantiate on communication channel transmitter and one communication channel receiver and supplies the shared signals. One approach is shown in FIG. 10. Note that the transmitter is assigned the given port number and the receiver is assigned the given port number plus one.

The MP router channel transmitter takes channel event information from system 10, converts it into the channel format and time multiplexes the channel data onto the physical channel. This device is shown in FIG. 11. In FIG. 11, the signal stmc is the channel to the logic design; it carries the channel data. The signal sak carries the acknowledges that come back across the channel in the other direction to indicate that a flit has been consumed by the remote device. The signal rak carries the acknowledges that a flit has been consumed by this device for the remote transmitter.

The submodule rtr_free tracks the number of free buffer spaces on a single virtual channel. This functionality is inside a submodule to reduce redundant code in the transmitter. The signal go, set by the transmitter to indicate that a flit is being sent, causes the free count to decrement. The signal ak, set by the receiver to indicate that a flow control unit has been accepted, causes the free count to increment. The signal block indicates that the free count has decremented to zero. Submodule rtr_free is shown in FIG. 12.

The MP router channel receiver takes a time multiplexed channel and converts it into channel event information for Raven. The signal rtmc is the channel from the logic design and carries the channel data The signal sak carries the acknowledges that come back across the channel in the other direction to indicate that a flit has been consumed by the remote device. The signal rak carries the acknowledges that a flit has been consumed by this device for the remote transmitter. The signal stall is a control that prevents flit acknowledges from being returned to the router to trick the router into thinking that the buffers are full in the stub. Acknowledges that are stalled are never lost but only buffered and returned in order once the stall is removed.

This stall mechanism is very simplistic for demonstration purposes, but a real stall mechanism might need to be more complex by allowing stalls on selectable virtual channels or by setting random interval delays for returning acknowledges. One approach to the MP router channel receiver is shown in FIG. 13.

With the wrapper defined, the diagnostic programming interface, or DPI, can be constructed. Recall that the diagnostic programming interface adapts the generic system programming interface into one more convenient to the design being verified.

In this example, the DPI is split into two components: a header file to be included by diagnostics and a C++ source file to be compiled and linked with the diagnostic. The DPI header file will be considered first, since it defines the structures implemented in the C++ source file.

The first step in the DPI header file is to define a bunch of constants that correspond to the different ports. While not absolutely necessary to do so, defining these constants has several advantages, the most important being that diagnostics written using these constants rather than hard coded numbers are insulated from future DPI changes. Using the constants also tends to make diagnostics easier to write and much easier to read, especially by someone else not as familiar with the DPI specifics.

The next step in the DPI header file is to define a message structure corresponding to the MP router messages. The message structure consists of storage for all the relevant fields and functions to convert to and from standard system 10 events. In building the router wrapper, it was obvious that a large number of different configurations of routers are possible. Under these conditions it is quite possible that alternate configurations may need to be exercised at a future time, so the DPI is constructed to allow for this possibility. It turns out to be rather simple to accomplish this by defining a port structure that can convert a node and location pair into a single Raven port number. The node specifies which router to reference and the location will specify which connection to the specific router to reference. Since the example has only one router, the port structure is not necessary, but included for completeness.

All the declarations in the DPI header file are within the name space mp (to help prevent name space clashes if this DPI ever needs to be used in conjunction with another DPI). A representative DPI is shown in FIG. 14.

The DPI C++ source file simply contains the implementations of the structure definitions in the DPI header file. In this case, only the conversions to and from standard system 10 events are present. None of these functions are very fancy; the definition, therefore, is very straightforward. An example DPI C++ source file is shown in FIG. 15.

The diagnostic programming interface described in FIGS. 14 and 15 did not take into consideration any event handling to allow the display of messages in a specific fashion. As a result, any event debugging will only show the events in their generic form. A good DPI would provide these handlers to make the output more legible.

With the wrapper and the diagnostic programming interface defined, the environment is ready for verification. This section provides some simple diagnostics to demonstrate some of the features of system 10 and how to use the newly created environment.

FIG. 16 illustrates a LOCK register test for the router. The LOCK register test has to validate that one and only one read request obtains the LOCK register value. The built-in possibilities and partners functionality of one embodiment of system 10 makes this a fairly simple test. The test first writes the LOCK register with a non-zero value and then simultaneously delivers a LOCK register read request on each of the ports using the apply command. Since there are four request messages, there are four possible outcomes. All four possibilities are declared in FIG. 16 using a verify command.

Next, a more traditional verification environment will be contrasted with verification system 10. Verification system 10 was used to test a 1.1 million gate ASIC which routes packetized messages on the interconnection network of a scalable multiprocessor.

The packet router chip chosen for this comparison is used to construct the interconnection network in a large-scale multiprocessor. The router chip represents a modestly complex logic design (~1.1 million logic gates) that will be used by several future multiprocessors. The router includes the following features: age-based priority, hardware support for barrier synchronization, and wormhole routing with software configurable routing tables. The router chip was chosen as a suitable case study for several reasons. It has been previously "verified" using a traditional test bench written in Verilog (herein referred to as VTB), requiring approximately 11,000 lines of Verilog code. Moreover, the router chip is used as the basic building block for constructing a message-passing fabric for a family of scalable multiprocessors.

A suite of directed and random diagnostics of varying complexity (some consisting of several thousand lines of Verilog code) were written for the VTB. The results are compared with an equivalent diagnostic written in verification system 10.

A fundamental tenet of verification system 10 is that abstraction can be used to reduce verification complexity and enhance readability and portability of diagnostics. This use of abstraction requires some overhead. However, with careful attention paid to the implementation details of kernel 24 the performance overhead is negligible. The performance impact of using verification system 10 can be characterized by comparing the performance of a diagnostic executing under the VTB and the equivalent diagnostic executing under verification system 10. Diagnostic execution time is used as a metric for comparing the performance of the VTB and verification system 10 environments. The diagnostic execution time is expressed in elapsed time to expose any latency as a result of communication overhead.

Diagnostic execution times for three different computing environments (uniprocessor (SGI Indigo2), distributed computing (using two SGI Indigo2's connected via 10-BaseT), and multiprocessor (SGI Origin2000), were obtained. The results were corrected to remove the effects of having other users on the system.

Decoupling diagnostic 16 and logic simulator 12 means rapid compile times for diagnostic development. In addition, the smaller executable size increases diagnostic performance by improving spatial locality. The decoupled approach, however, does introduce some inherent overhead for the interprocess communication (IPC) mechanism.

Tests show that system 10 performs very well on a uniprocessor, outperforming the VTB by as much as 9%. However, in a distributed computing environment the IPC overhead impedes the verification system 10 diagnostic performance by as much as 10%. Similarly, the system 10 diagnostic on a multiprocessor was bogged down by IPC overhead.

A distinct advantage of the verification system 10 execution model is the ability to overlap execution of logic simulator 12 with the diagnostic 16 execution. This overlap can effectively mask the IPC overhead and improve performance by allowing any computation done by the diagnostic to execute concurrently with the logic simulation.

Most diagnostics are similar to the following:

```
/* preamble */
for(I=1; 1 f N; I++)
{
    apply(SOME EVENT);
    variable workload(\Delta \Delta \Delta);   // do something useful
    verify(SOME EVENT CORRECT);
    await(SOME EVENT CORRECT);
}
...
```

Figure 4:
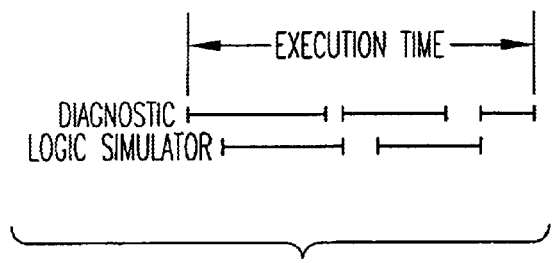
FIG. 4 illustrated overlap between computations performed for the diagnostic and computations performed as part of the logic simulation.

It is very common for the diagnostic to perform some computation which may be used to validate the expected behavior of the hardware design. For instance, one might compute a cyclic redundancy check (CRC) value for an expected message. Often, this work can be overlapped with the logic simulation, with the diagnostic and simulation only needing to synchronize to maintain any event ordering dependencies (as shown in FIG. 4). Theoretically, if the diagnostic and logic simulator execution completely overlapped, we could see a speedup of 2. However, in practical terms this isn't likely. Real-world diagnostics require some explicit synchronization which limits parallelism. In addition, external events such as IPC overhead, cache interference, etc. make a speedup of two unattainable.

Figure 5:
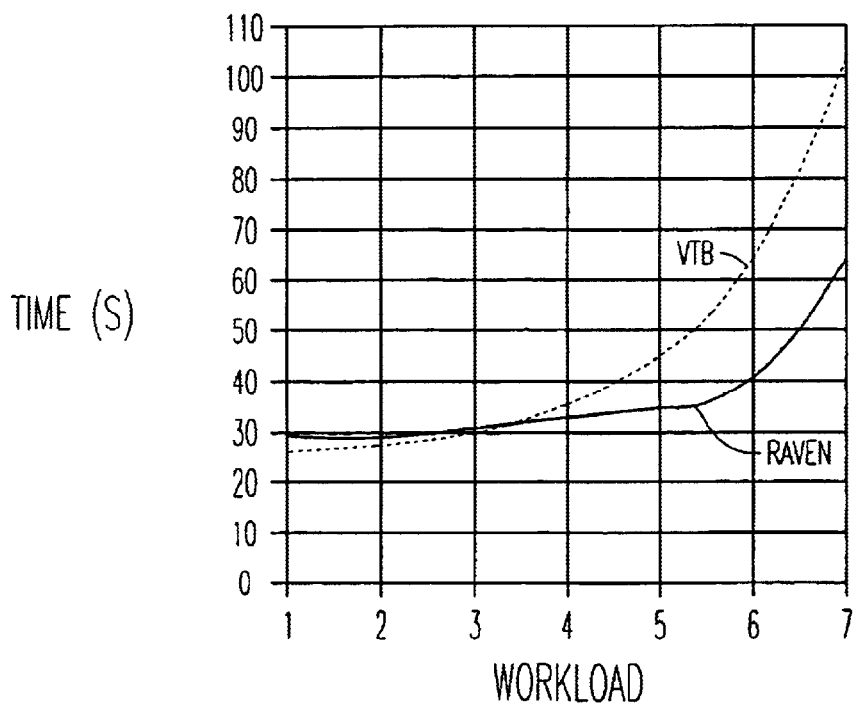
FIG. 5 illustrates how a verification system according to the present invention takes advantage of a multiprocessor system to achieve an execution speedup.

FIG. 5 illustrates how verification system 10 takes advantage of a multiprocessor system to achieve a speedup of 1.6 for larger workloads. The "knee of the curve" in FIG. 5 is shifted to the right illustrating the scalability of the system 10 execution model. As large workloads are applied, verification system 10 takes advantage of any overlapping execution between the logic simulator and diagnostic.

The verification of large-scale multiprocessors is mired in complexity. A novel solution has been proposed for mitigating this complexity through the use of an abstracted verification environment. Among its merits, verification system 10 can provide a uniform diagnostic programming interface (DPI) built upon the C/C++ programming language. This use of abstraction enhances the readability and portability of diagnostic, allowing them to be leveraged on future projects.

In addition, verification system 10 employs a decoupled execution model for the diagnostic and logic simulator. Under the verification system 10 environment, diagnostics are developed in C/C++ using high-level constructs such as apply(event) and verify(event) to apply stimulus and validate results from a logic simulator, with explicit synchronization using the await(event) primitive. Verification system 10 kernel manages concurrent diagnostic threads of execution using parallel and merge primitives.

These features, combined with standard C/C++ compilers and debuggers, provide a very versatile verification framework.

Verification system 10 provides the following benefits: (1) easier diagnostic development in C/C++, (2) portability of diagnostics from one project to the next, and (3) scalability. The first benefit is fairly obvious, most engineers are fluent in C/C++ programming. The second benefit, improved portability, comes from isolating project-specific details (e.g. packet format, channel protocols, etc) in the Diagnostic Programming Interface (DPI) layer. Improved scalability—being able to construct much larger logic simulations, comes from verification system 10's decoupled execution model.

In addition, system 10 shows very encouraging performance results. The worst-case interprocess communication (IPC) overhead is approximately 10% on a distributed computing environment, and approximately 15% on a multiprocessor. This overhead is negligible when diagnostic computation can be overlapped with the execution of the logic simulator, achieving as much as 1.6 speedup over the equivalent Verilog test bench (VTB) diagnostic.

In years past, prior to high-level languages, computer programmers were forced to program in the native assembly language of their target platform. However, as the computer programs became more complex, the size and maintenance of assembly language programs became untenable. With the advent of high-level languages, such as C and Pascal, programmers were abstracted from the gory details of the instruction set architecture of the target platform. As a result, they were able to develop more complex, portable, and maintainable programs. In much the same way as high-level languages provoked the evolution of computer programs, verification system 10 is a catalyst for evolving hardware design verification.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and

What is claimed is:

1. A logic verification system, comprising:
    a hardware simulator;
    a diagnostic system capable of running a diagnostic program;
    an interprocess communication mechanism for transferring stimulus from the diagnostic system to the hardware simulator and for transferring results from the hardware simulator to the diagnostic system; and
    a verification environment, wherein the verification environment includes two or more layers of abstraction placed between logic being verified and the diagnostic program, wherein the layers of abstraction include:
    a logic design representative of the logic being verified;
    a logic design wrapper; and
    a verification kernel, wherein the verification kernel includes a diagnostic kernel and a simulation kernel, wherein the diagnostic kernel and the simulation kernel communicate through the interprocess communication mechanism;
    wherein the logic design, the logic design wrapper and the simulation kernel are linked to form a logic simulator.

2. The logic verification system according to claim 1, wherein the verification environment further includes a diagnostic programming interface, and wherein the diagnostic program, the diagnostic programming interface and the diagnostic kernel are linked to form a diagnostic test.

3. The logic verification system according to claim 2, wherein the diagnostic programming interface is a program library that adapts abstract data structures in the diagnostic program to structures in the verification kernel.

4. The logic verification system according to claim 2, wherein the diagnostic kernel is a program library which operates on events.

5. The logic verification system according to claim 4, wherein events include wiggles and bundles.

6. The logic verification system according to claim 4, wherein the verification environment further includes a logic design representative of the device being verified and a logic design wrapper, and wherein the logic design, the logic design wrapper and the simulation kernel are linked to form a logic simulator.

7. The logic verification system according to claim 6, wherein the logic design wrapper is a program library that adapts the simulation kernel to the logic design.

8. The logic verification system according to claim 4, wherein the verification environment further includes a four-state variable data structure.

9. The logic verification system according to claim 1, wherein the logic design wrapper includes a program library that adapts the simulation kernel to the logic design.

10. The logic verification system according to claim 1, wherein the simulation kernel includes a program library which operates on events.

11. The logic verification system according to claim 1, wherein the simulation kernel includes a program library which operates on wiggles and bundles.

12. The logic verification system according to claim 1, wherein the simulation kernel is a program library which operates on events.

13. The logic verification system according to claim 1, wherein the simulation kernel is a program library which operates on wiggles and bundles.

14. The logic verification system according to claim 1, wherein the verification environment further includes a group data structure used to declare an array of undetermined length.

15. The logic verification system according to claim 14, wherein the verification environment further includes a length function, wherein the length function returns length of an array declared using the group data structure.

16. A logic verification system, comprising:
    a hardware simulator;
    a diagnostic system;
    an interprocess communication mechanism for transferring stimulus from the diagnostic system to the hardware simulator and for transferring results from the hardware simulator to the diagnostic system;
    a verification environment, wherein the verification environment includes two or more layers of abstraction placed between logic being verified and a diagnostic program, wherein one of the layers of abstraction is a verification kernel, wherein the verification kernel includes a diagnostic kernel and a simulation kernel and wherein the diagnostic kernel and the simulation kernel communicate through the interprocess communication mechanism; and
    wherein the verification environment further includes a plurality of ports, including an event port, wherein the event port drives and captures events.

17. The logic verification system according to claim 16, wherein the plurality of ports includes a memory back door port, wherein the memory back door port is used to construct a memory model.

18. A logic verification system, comprising:
a hardware simulator;
a diagnostic system;
an interprocess communication mechanism for transferring stimulus from the diagnostic system to the hardware simulator and for transferring results from the hardware simulator to the diagnostic system;
a verification environment, wherein the verification environment includes two or more layers of abstraction placed between logic being verified and a diagnostic program, wherein one of the layers of abstraction is a verification kernel, wherein the verification kernel includes a diagnostic kernel and a simulation kernel and wherein the diagnostic kernel and the simulation kernel communicate through the interprocess communication mechanism; and
wherein the verification environment diagnostic program generates stimulus via a DPI apply.

19. A method of verifying an electronic system, comprising:
providing a verification kernel;
expressing the electronic system as a logic design;
defining a wrapper, wherein the wrapper is an interface between the logic design and the verification kernel;
placing tests to be run against the logic design within a diagnostic program;
defining a diagnostic program interface, where the diagnostic program interface is an interface between the diagnostic program and the verification kernel;
executing the tests against the logic design;
reporting results of the tests; and
validating the results against expected results;
wherein defining a wrapper includes compiling the logic design and the wrapper into an object file, wherein the object file is linked with verification kernel routines to create an executable logic simulator.

20. The method according to claim 19, wherein executing the tests against the logic design includes establishing an inter-process communication (IPC) layer between the diagnostic program and the logic simulator.

21. A method of verifying an electronic system, comprising:
providing a verification kernel;
expressing the electronic system as a logic design;
defining a wrapper, wherein the wrapper is an interface between the logic design and the verification kernel;
placing tests to be run against the logic design within a diagnostic program;
defining a diagnostic program interface, where the diagnostic program interface is an interface between the diagnostic program and the verification kernel;
executing the tests against the logic design;
reporting results of the tests; and
validating the results against expected results;
wherein executing includes executing recovery code when an exception is detected.

22. The method according to claim 21, wherein executing further includes trapping to a handler routine on occurrence of an exception.

23. The method according to claim 21, wherein executing further includes cooperative multitasking of a plurality of threads.

24. The method according to claim 23, wherein cooperative multitasking includes communicating between threads via a semaphore variable.

25. The method according to claim 23, wherein cooperative multitasking includes controlling execution of threads via a barrier function.

26. The method according to claim 21, wherein executing further includes waiting for a nondeterministic outcome.

27. The method according to claim 21, wherein executing further includes popping events off an event queue.

28. A method of verifying an electronic system, comprising:
providing a verification kernel;
expressing the electronic system as a logic design;
defining a wrapper, wherein the wrapper is an interface between the logic design and the verification kernel;
placing tests to be run against the logic design within a diagnostic program;
defining a diagnostic program interface, where the diagnostic program interface is an interface between the diagnostic program and the verification kernel;
executing the tests against the logic design;
reporting results of the test; and
validating the results against expected results;
wherein executing includes popping wiggles off a wiggle queue and popping bundles off one or more bundles queues.

29. The method according to claim 28 wherein executing includes performing an examine function to detect a change of state.

30. A method of verifying an electronic system, comprising:
providing a verification kernel;
expressing the electronic system as a logic design;
defining a wrapper, wherein the wrapper is an interface between the logic design and the verification kernel;
placing tests to be run against the logic design within a diagnostic program;
defining a diagnostic program interface, where the diagnostic program interface is an interface between the diagnostic program and the verification kernel;
executing the tests against the logic design;
reporting results of the tests; and
validating the results against expected results;
wherein executing includes referencing memories built using memory access PLI tasks.

31. A system for simulating operation of an electronic device, comprising:
a hardware simulator;
a diagnostic system; and
an interprocess communication mechanism for transferring stimulus from the diagnostic system to the hardware simulator and for transferring results from the hardware simulator to the diagnostic system;
wherein the simulator is capable of receiving connections and commands from a diagnostic program running on the diagnostic system, of executing the commands as directed and of returning results to the diagnostic system; and
wherein the hardware simulator includes a simulator kernel, a logic design wrapper and a logic design representative of the electronic device.

32. The system according to claim 31, wherein the logic design wrapper includes a program library that adapts the simulation kernel to the logic design.

33. The system according to claim 32, wherein the simulation kernel includes a program library which operates on events.

34. The system according to claim 32, wherein the simulation kernel includes a program library which operates on wiggles and bundles.

35. The system according to claim 31, wherein the diagnostic system includes a group data structure used to declare an array of undetermined length.

36. The system according to claim 35, wherein the diagnostic system includes a length function, wherein the length function returns length of an array declared using the group data structure.

37. The system according to claim 31, wherein the diagnostic system includes a four-state variable data structure.

38. A system for simulating operation of an electronic device, comprising:

a hardware simulator;

a diagnostic system; and an interprocess communication mechanism for transferring stimulus from the diagnostic system to the hardware simulator and for transferring results from the hardware simulator to the diagnostic system;

wherein the simulator is capable of receiving connections and commands from a diagnostic program running on the diagnostic system, of executing the commands as directed and of returning results to the diagnostic system; and wherein the diagnostic system includes a plurality of ports, including an event port, wherein the event port drives and captures events.

39. The system according to claim 38, wherein the plurality of ports includes a memory back door port, wherein the memory back door port is used to construct a memory model.

40. A system for simulating operation of an electronic device, comprising:

a hardware simulator;

a diagnostic system; and an interprocess communication mechanism for transferring stimulus from the diagnostic system to the hardware simulator and for transferring results from the hardware simulator to the diagnostic system;

wherein the simulator is capable of receiving connections and commands from a diagnostic program running on the diagnostic system, of executing the commands as directed and of returning results to the diagnostic system; and wherein the diagnostic program generates stimulus via a DPI apply.

* * * * *

UNITED STATES PATENT AND TRADEMARK OFFICE
CERTIFICATE OF CORRECTION

PATENT NO. : 6,856,950 B1
DATED : February 15, 2005
INVENTOR(S) : Abts et al.

It is certified that error appears in the above-identified patent and that said Letters Patent is hereby corrected as shown below:

Title page,
Item [56], References Cited, OTHER PUBLICATIONS, "Liu" reference, delete "et al," and insert -- et al., -- therefor; "Mascarenhas" reference, delete "et al," and insert -- et al., --; and "Abts" reference, delete "Multiprocessore" and insert -- Multiprocessor --, therefor.

Column 52,
Line 7, insert -- the -- before "events".

Column 54,
Line 20, delete "test;" and insert -- tests; --, therefor.

Signed and Sealed this

Thirty-first Day of May, 2005

JON W. DUDAS
*Director of the United States Patent and Trademark Office*